US012772452B2

(12) United States Patent
Min et al.

(10) Patent No.: US 12,772,452 B2
(45) Date of Patent: Oct. 20, 2026

(54) SEMICONDUCTOR DEVICE AND AN ELECTRONIC SYSTEM INCLUDING THE SAME

(71) Applicant: SAMSUNG ELECTRONICS CO., LTD., Suwon-si (KR)

(72) Inventors: Juseong Min, Suwon-si (KR); Jae-Bok Baek, Suwon-si (KR); Jeehoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 18/383,532

(22) Filed: Oct. 25, 2023

(65) Prior Publication Data

US 2024/0324231 A1 Sep. 26, 2024

(30) Foreign Application Priority Data

Mar. 21, 2023 (KR) ........................ 10-2023-0036731

(51) Int. Cl.

| | |
|---|---|
| ***H10B 43/40*** | (2023.01) |
| ***H10B 41/27*** | (2023.01) |
| ***H10B 41/41*** | (2023.01) |
| ***H10B 43/27*** | (2023.01) |

(52) U.S. Cl.

CPC ............. *H10B 43/40* (2023.02); *H10B 41/27* (2023.02); *H10B 41/41* (2023.02); *H10B 43/27* (2023.02)

(58) Field of Classification Search

CPC ........ H10B 41/10; H10B 41/40; H10B 41/50; H10B 43/10; H10B 43/35; H10B 43/50

See application file for complete search history.

(56) References Cited

U.S. PATENT DOCUMENTS

| | | | | |
|---|---|---|---|---|
| 7,052,983 | B2 | 5/2006 | Park et al. | |
| 8,823,094 | B2 | 9/2014 | Lee | |
| 9,536,825 | B2 | 1/2017 | You et al. | |
| 9,859,422 | B2 | 1/2018 | Nishikawa et al. | |
| 11,282,851 | B2 | 3/2022 | Kwon et al. | |
| 11,450,768 | B2 | 9/2022 | Togo | |
| 2015/0287907 | A1* | 10/2015 | Park ....................... | H10N 50/10 257/421 |
| 2016/0351709 | A1* | 12/2016 | Nishikawa ........... | H10D 30/608 |

(Continued)

FOREIGN PATENT DOCUMENTS

| | | |
|---|---|---|
| KR | 10-2231205 | 3/2021 |

*Primary Examiner* — Fazli Erdem

(74) *Attorney, Agent, or Firm* — Morgan, Lewis & Bockius LLP

(57) ABSTRACT

A semiconductor device includes: a gate electrode on a semiconductor substrate; a gate dielectric pattern between the gate electrode and the semiconductor substrate; a first semiconductor pattern on the semiconductor substrate adjacent to a first side of the gate electrode; and a second semiconductor pattern on the semiconductor substrate adjacent to a second side of the gate electrode, wherein the first semiconductor pattern includes: a first via part in contact with the semiconductor substrate; and a first plate part on the first via part, wherein the second semiconductor pattern includes: a second via part in contact with the semiconductor substrate; and a second plate part on the second via part, wherein each of the first and second plate parts extends lengthwise in a direction parallel to a top surface of the semiconductor substrate.

18 Claims, 32 Drawing Sheets

(56) References Cited

U.S. PATENT DOCUMENTS

| | | | | |
|---|---|---|---|---|
| 2019/0296012 | A1 * | 9/2019 | Iwata | H10D 64/0113 |
| 2019/0371808 | A1 * | 12/2019 | Choi | H10B 43/35 |
| 2022/0109054 | A1 * | 4/2022 | Togo | H10D 62/151 |
| 2022/0208783 | A1 * | 6/2022 | Seo | H10B 43/40 |

* cited by examiner

SEMICONDUCTOR DEVICE AND AN ELECTRONIC SYSTEM INCLUDING THE SAME

CROSS-REFERENCE TO RELATED APPLICATION

This U.S. nonprovisional patent application claims priority under 35 U.S.C. § 119 to Korean Patent Application No. 10-2023-0036731 filed on Mar. 21, 2023 in the Korean Intellectual Property Office, the disclosure of which is incorporated by reference herein in its entirety.

TECHNICAL FIELD

The present inventive concept relates to a semiconductor device and an electronic system including the same.

DISCUSSION OF RELATED ART

In electronic systems that require data storage, there is a need for semiconductor devices that can store large amounts of data. Therefore, research has been undertaken to increase the data storage capacity of these devices. For example, in one method to increase the data storage capacity of a semiconductor device, memory cells are arranged three-dimensionally instead of two-dimensionally.

SUMMARY

Some embodiments of the present inventive concept provide a semiconductor device with improved reliability and increased integration.

Some embodiments of the present inventive concept provide an electronic system including a semiconductor device.

According to some embodiments of the present inventive concept, there is provided a semiconductor device including: a gate electrode on a semiconductor substrate; a gate dielectric pattern between the gate electrode and the semiconductor substrate; a first semiconductor pattern on the semiconductor substrate adjacent to a first side of the gate electrode; and a second semiconductor pattern on the semiconductor substrate adjacent to a second side of the gate electrode, wherein the first semiconductor pattern includes: a first via part in contact with the semiconductor substrate; and a first plate part on the first via part, wherein the second semiconductor pattern includes: a second via part in contact with the semiconductor substrate; and a second plate part on the second via part, wherein each of the first and second plate parts extends lengthwise in a direction parallel to a top surface of the semiconductor substrate.

According to some embodiments of the present inventive concept, there is provided a semiconductor device including: a device isolation layer that defines an active region on a semiconductor substrate; a gate electrode disposed on the active region; a gate dielectric pattern between the gate electrode and the semiconductor substrate; a semiconductor pattern on a first side of the gate electrode, wherein the semiconductor pattern includes a via part in contact with the semiconductor substrate and a plate part on the via part; and a contact plug in contact with a portion of the plate part and spaced apart from the via part when viewed in a plan.

According to some embodiments of the present inventive concept, there is provided a semiconductor device including: a peripheral circuit structure that includes peripheral circuits integrated on a semiconductor substrate; and a cell array structure on the peripheral circuit structure and including memory cells that are three-dimensionally arranged on a semiconductor layer, wherein the peripheral circuit structure includes: a gate electrode on the semiconductor substrate; a gate dielectric pattern between the gate electrode and the semiconductor substrate; a source region and a drain region in the semiconductor substrate, and adjacent to a corresponding one of opposite sides of the gate electrode, respectively; a plurality of semiconductor patterns correspondingly coupled to the source region and the drain region, each of the semiconductor patterns including a via part that penetrates a dielectric layer on the semiconductor substrate and a plate part connected to the via part on the dielectric layer; and a plurality of contact plugs correspondingly coupled to the plurality of semiconductor patterns, each of the contact plugs being in contact with a portion of the plate part, wherein the plate part extends lengthwise in a direction parallel to a top surface of the semiconductor substrate.

DETAILED DESCRIPTION OF THE EMBODIMENTS

The following will now describe some embodiments of the present inventive concept in conjunction with the accompanying drawings.

Figure 1:
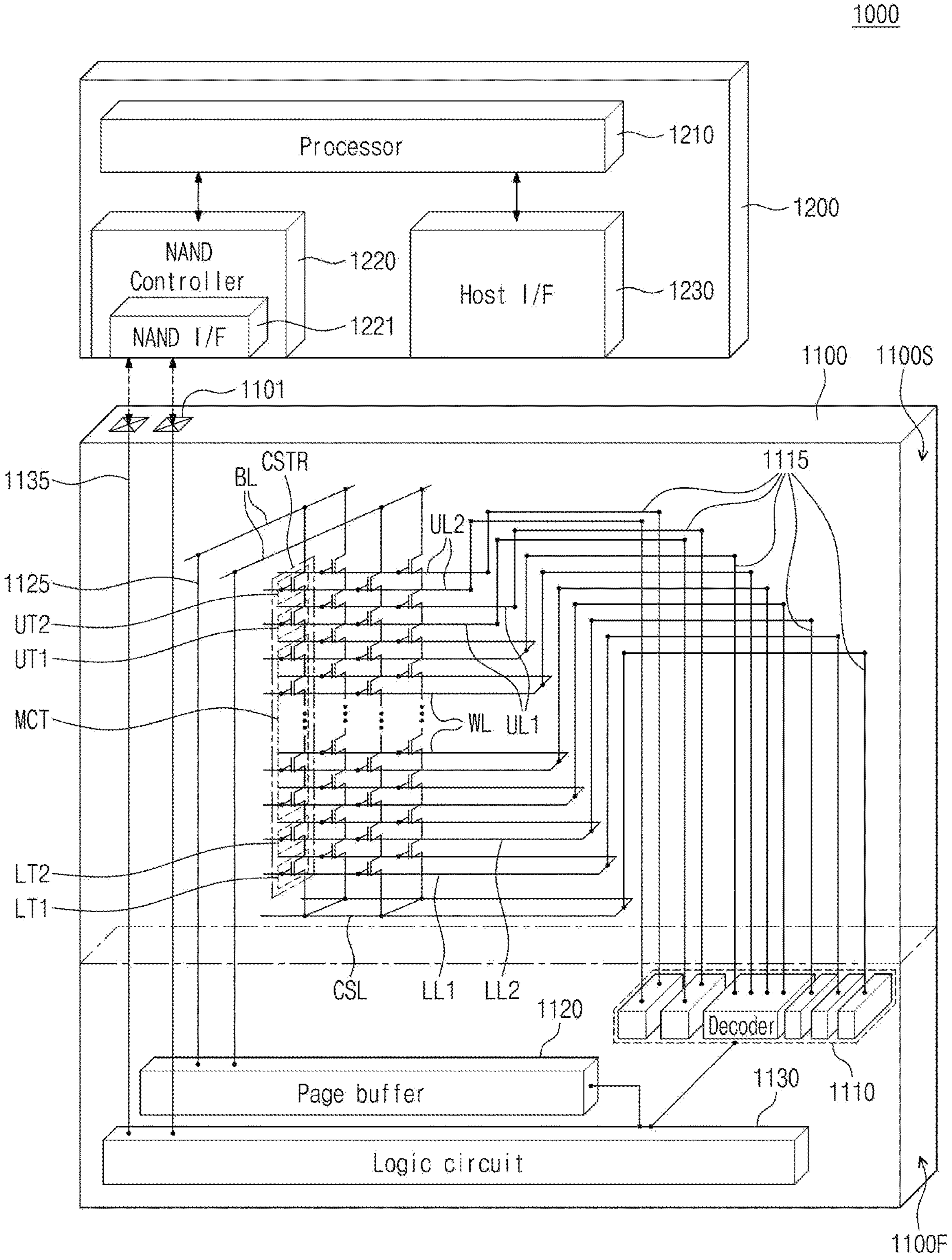
FIG. 1 illustrates a simplified schematic diagram showing an electronic system that includes a semiconductor device according to some embodiments of the present inventive concept.

FIG. 1 illustrates a simplified schematic diagram showing an electronic system that includes a semiconductor device according to some embodiments of the present inventive concept.

Referring to FIG. 1, an electronic system 1000 according to some embodiments of the present inventive concept may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as an NAND Flash memory device. The semiconductor device 1100 may include a first structure 1100F and a second structure 1100S on the first structure 1100F. In some embodiments, the first structure 1100F may be disposed on a side of the second structure 1100S.

The first structure 1100F may be a peripheral circuit structure that includes a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erase control transistor LT1 and a ground selection transistor LT2 that are connected in series. The upper transistors UT1 and UT2 may include a string selection transistor UT1 and an upper erase control transistor UT2 that are connected in series. One or both of the lower and upper erase control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation with respect to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The first structure 1100F may include a voltage generator. The voltage generator may produce program voltages, read voltages, pass voltages, and verification voltages that are required for operating the memory cell strings CSTR. The program voltage may be relatively higher (e.g., about 20 V to about 40 V) than the read voltage, the pass voltage, and the verification voltage.

In some embodiments, the first structure 1100F may include high-voltage transistors and low-voltage transistors. The decoder circuit 1110 may include pass transistors connected to the word lines WL of the memory cell strings CSTR. The pass transistors may include high-voltage transistors capable of withstanding high voltages such as program voltages applied to the word lines WL in a program operation. The page buffer 1120 may also include high-voltage transistors capable of withstanding high voltages.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer a control command to control the semiconductor device 1100, data intended to be written on the memory cell transistors MCT of the semiconductor device 1100, and/or data intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
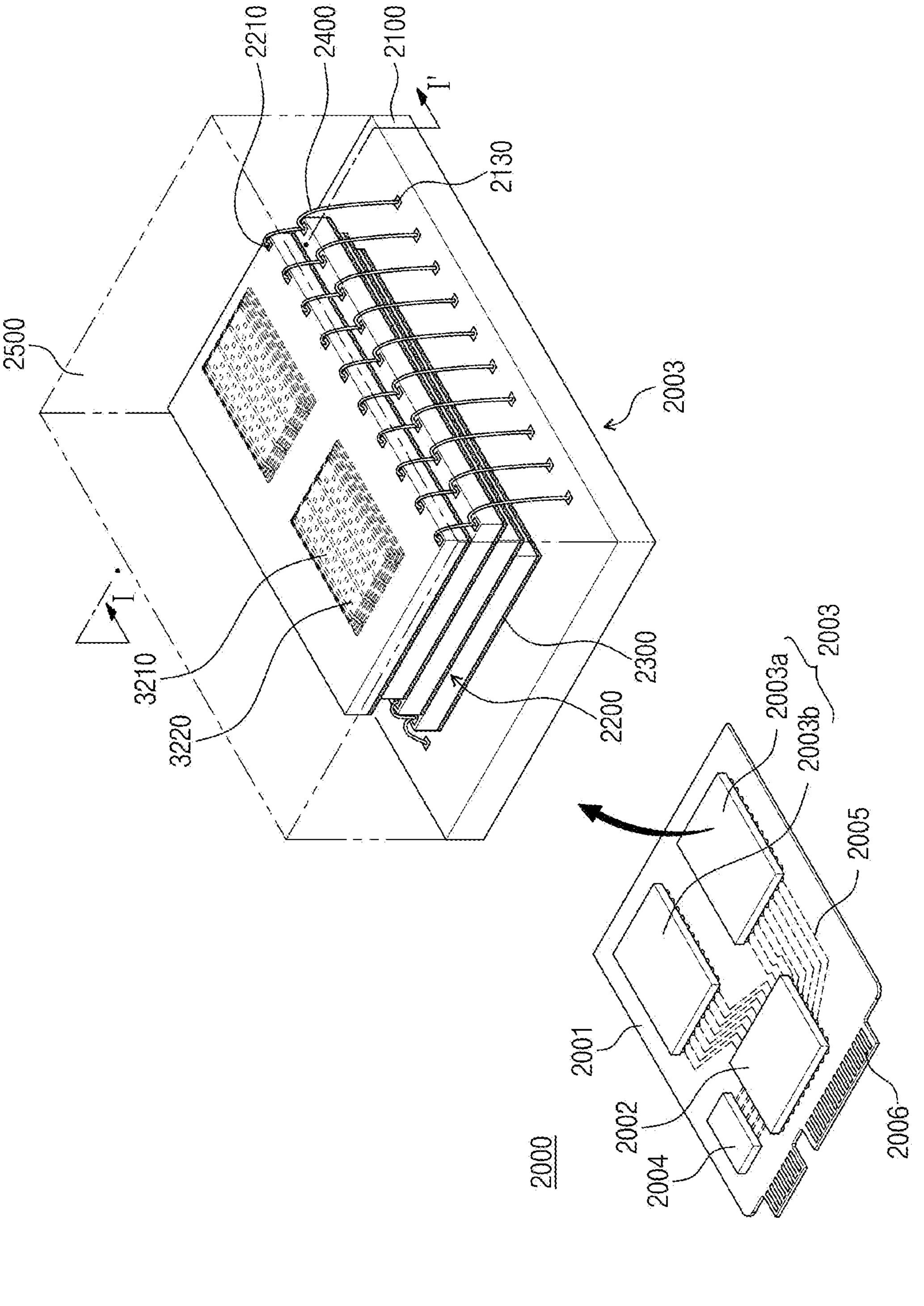
FIG. 2 illustrates a simplified perspective view showing an electronic system that includes a semiconductor device according to some embodiments of the present inventive concept.

FIG. 2 illustrates a simplified perspective view showing an electronic system that includes a semiconductor device according to some embodiments of the present inventive concept.

Referring to FIG. 2, an electronic system 2000 according to some embodiments of the present inventive concept may include a main board 2001, and may also include a controller 2002, at least one semiconductor package 2003, and a dynamic random access memory (DRAM) 2004 that are mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are coupled to an external host. The number and arrangement of the plurality of pins in the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PCI-Express), serial advanced technology attachment (SATA), and M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages 2003*a* and 2003*b* that are spaced apart from each other. The semiconductor package 2003 may include other semiconductor packages in addition to the first and second semiconductor packages 2003*a* and 2003*b*. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesion layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 1. Each of the semiconductor chips 2200 may include gate stack structures 3210 and vertical structures 3220. Each of the semiconductor chips 2200 may include a semiconductor device according to some embodiments of the present inventive concept which will be discussed below.

In some embodiments, the connection structures 2400 may be bonding wires that electrically connect the input/output pads 2210 to the package upper pads 2130. Therefore, in each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some embodiments, on each of the first and second semiconductor packages 2003*a* and 2003*b*, the semiconductor chips 2200 may be electrically connected to each other through connection structures such as through silicon vias (TSV) instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
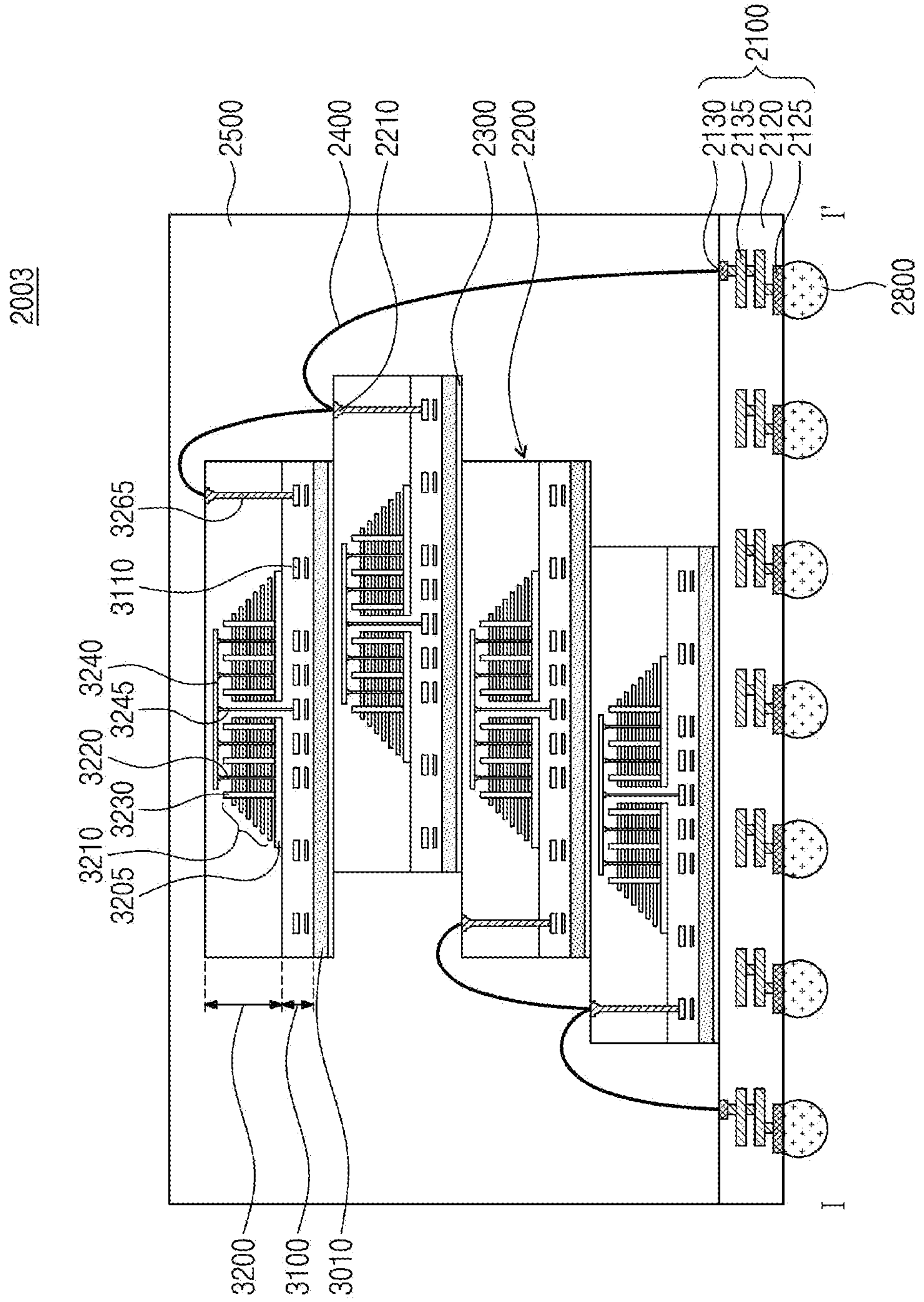
FIGS. 3 and 4 illustrate simplified cross-sectional views showing a semiconductor package according to some embodiments of the present inventive concept.
Figure 4:
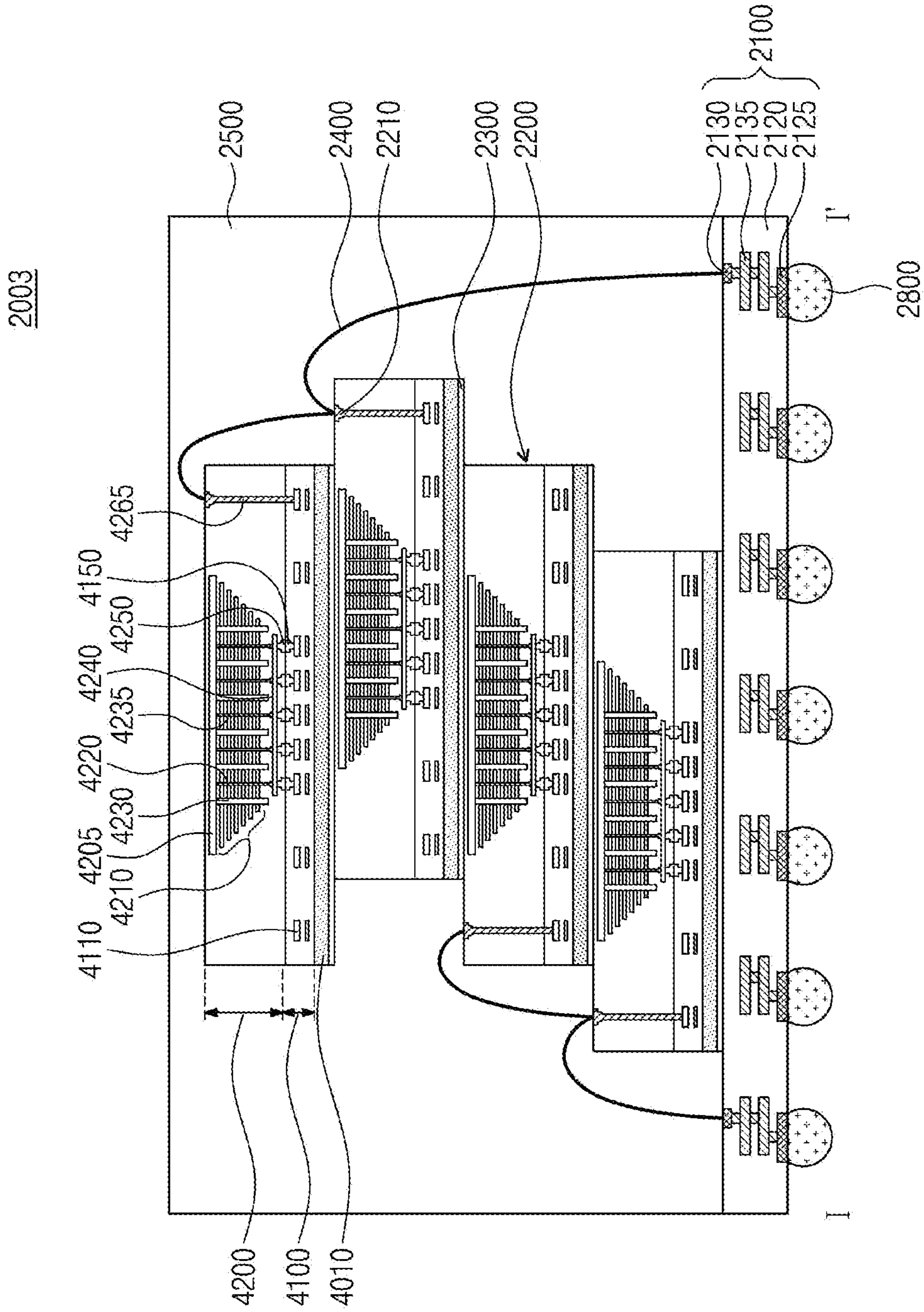

FIGS. 3 and 4 illustrate simplified cross-sectional views showing a semiconductor package according to some embodiments of the present inventive concept. FIGS. 3 and 4 each depicts an example of the semiconductor package illustrated in FIG. 2, showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, package upper pads 2130 disposed or exposed on a top surface of the package substrate body 2120, package lower pads 2125 disposed or exposed on a bottom surface of the package substrate body 2120, and internal wiring lines 2135 that electrically connect the package upper pads 2130 to the package lower pads 2125. The package upper pads 2130 may be electrically connected to the connection structures 2400. The package lower pads 2125 may be connected through conductive connectors 2800 to the wiring patterns 2005 in the main board 2001 of the electronic system 2000 as shown in FIG. 2. The conductive connectors 2800 may be shaped as bumps.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures 3230 that penetrate the stack structure 3210, bit lines 3240 electrically connected to the vertical structures 3220, and cell contact plugs electrically connected to the word lines (see WL of FIG. 1) of the stack structure 3210. Each of the first structure 3100, the second structure 3200, and the semiconductor chips 2200 may further include separation structures which will be discussed below.

Each of the semiconductor chips 2200 may include one or more through wiring lines 3245 that extend into the second structure 3200 and are electrically connected to the peripheral wiring lines 3110 of the first structure 3100. The through wiring line 3245 may be disposed outside the stack structure 3210 and may further be disposed to penetrate the stack structure 3210. Each of the semiconductor chips 2200 may further include one or more input/output pads (see 2210 of FIG. 2) electrically connected to the peripheral wiring lines 3110 of the first structure 3100.

Referring to FIG. 4, on the semiconductor package 2003, each of the semiconductor chips 2200 may include a semiconductor substrate 4010, a first structure 4100 on the semiconductor substrate 4010, and a second structure 4200 wafer-bonded to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and separation structures 4230 that penetrate the stack structure 4210, and second bonding structures 4250 electrically connected to the vertical structures 4220 and the word lines (see WL of FIG. 1) of the stack structure 4210. For example, the second bonding structures 4250 may be electrically connected to the vertical structures 4220 through bit lines 4240 electrically connected to the vertical structures 4220, and may also be electrically connected to the word lines (see WL of FIG. 1) through cell contact plugs electrically connected to the word lines (see WL of FIG. 1). The first bonding structures 4150 of the first structure 4100 and the second bonding structures 4250 of the second structure 4200 may be bonded to each other while being in contact with each other. The first and second bonding structures 4150 and 4250 may have their bonding portions formed of, for example, copper (Cu).

Each of the first structures 4100, the second structures 4200, and the semiconductor chips 2200 may further include a source structure according to some embodiments discussed above. Each of the semiconductor chips 2200 may further include input/output pads 2210 electrically connected to the peripheral wiring lines 4110 of the first structure 4100.

The semiconductor chips 2200 of FIG. 3 may be electrically connected to each other through the connection structures 2400 shaped like bonding wires, and this may hold true for the semiconductor chips 2200 of FIG. 4. In some embodiments, semiconductor chips (e.g., the semiconductor chips 2200 of FIG. 3 or the semiconductor chips 2200 of FIG. 4) in a single semiconductor package may be electrically connected to each other through one or more connection structures that include through electrodes such as a through silicon via (TSV).

The first structure 3100 of FIG. 3 and the first structure 4100 of FIG. 4 may correspond to a peripheral circuit structure which will be discussed in the following embodiments, and the second structure 3200 of FIG. 3 and the second structure 4200 of FIG. 4 may correspond to a cell array structure which will be discussed in the following embodiments.

Figure 5:
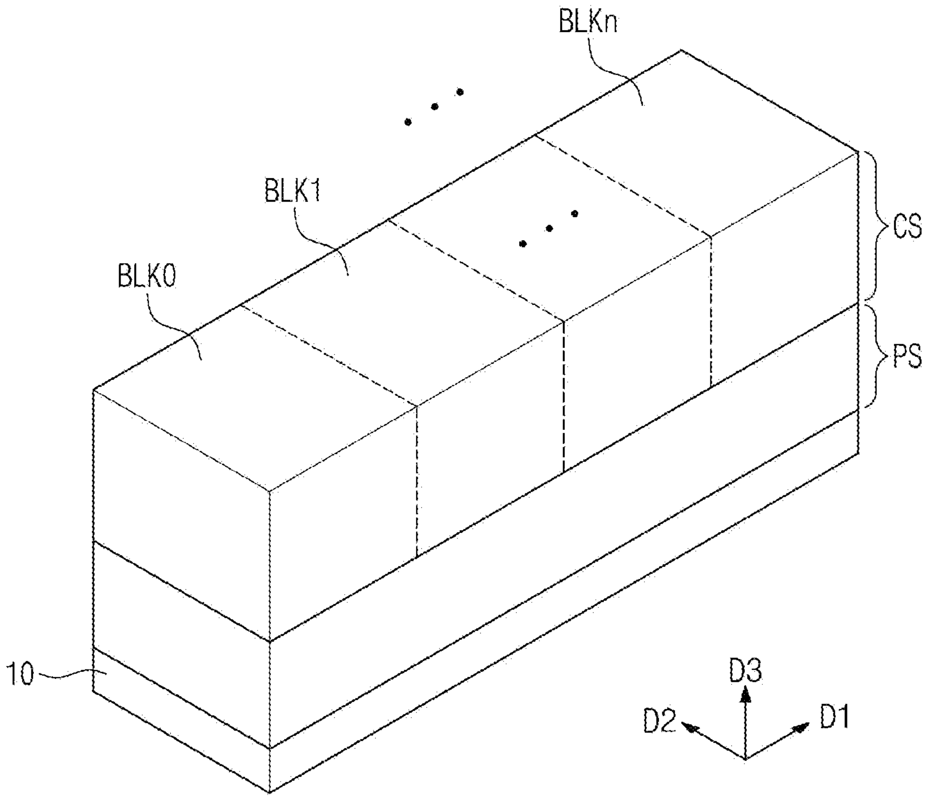
FIGS. 5 and 6 illustrate simplified perspective views showing a semiconductor device according to some embodiments of the present inventive concept.
Figure 6:
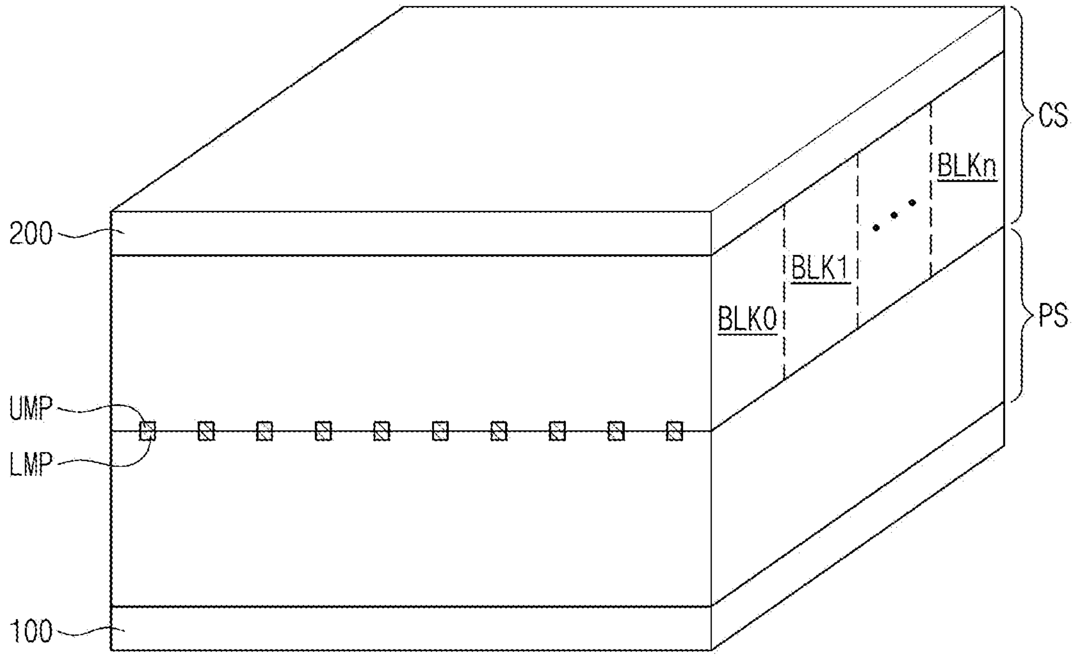

FIGS. 5 and 6 illustrate simplified perspective views showing a semiconductor device according to some embodiments of the present inventive concept.

Referring to FIG. 5, a semiconductor device may include a peripheral circuit structure PS on a semiconductor substrate 10 and a cell array structure CS on the peripheral circuit structure PS.

The peripheral circuit structure PS may include peripheral circuits formed on the semiconductor substrate 10. The peripheral circuits may include row and column decoders, a page buffer, a voltage generator, and a control circuit. The row and column decoders, the page buffer, the voltage generator, and the control circuit of the peripheral circuit structure PS may correspond to those discussed with reference to FIG. 1.

When viewed in plan, the cell array structure CS may overlap the peripheral circuit structure PS. In other words, the peripheral circuit structure PS may be disposed between the cell array structure CS and the semiconductor substrate 10. The cell array structure CS may include a plurality of memory blocks BLK0 to BLKn each of which is a data erase unit. Each of the memory blocks BLK0 to BLKn may include a memory cell array having a three-dimensional structure (or vertical structure). Each of the memory blocks BLK0 to BLKn may include the memory cell strings (see CSTR of FIG. 1) discussed with reference to FIG. 1.

Referring to FIG. 6, a peripheral circuit structure PS may include peripheral circuits formed on a first substrate 100. The peripheral circuits may include row and column decoders, a page buffer, a voltage generator, and a control circuit similar to those discussed with reference to FIG. 1.

The peripheral circuit structure PS may be provided with lower metal pads LMP at top thereof. The lower metal pads LMP may be electrically connected to the peripheral circuits.

A cell array structure CS may include a memory cell array including memory cells that are three-dimensionally arranged on a second substrate 200. The memory cell array may include a plurality of memory blocks BLK0 to BLKn as discussed above. Each of the memory blocks BLK0 to BLKn may include the memory cell strings (see CSTR of FIG. 1) discussed with reference to FIG. 1.

The cell array structure CS may be provided with upper metal pads UMP at top thereof. The upper metal pads UMP may be electrically connected to the memory cell array.

The lower and upper metal pads LMP and UMP may have substantially the same size and arrangement. The lower and upper metal pads LMP and UMP may include, for example, copper (Cu), aluminum (Al), nickel (Ni), cobalt (Co), tungsten (W), titanium (Ti), tin (Sn), or any alloy thereof. Pairs of the lower and upper metal pads LMP and UMP may be in contact with each other.

The semiconductor memory device according to some embodiments of the present inventive concept may be fabricated by forming the peripheral circuit structure PS including the peripheral circuits on the first substrate 100, forming the cell array structure CS including the memory cells on the second substrate 200 different from the first substrate 100, and then using a bonding method to connect the first substrate 100 to the second substrate 200. For example, a bonding method may be employed to electrically and physically connect the lower metal pads LMP of the peripheral circuit structure PS to the tipper metal pads UMP of the cell array structure CS. Thus, the lower metal pads LMP may be in direct contact with the upper metal pads UMP.

Figure 7:
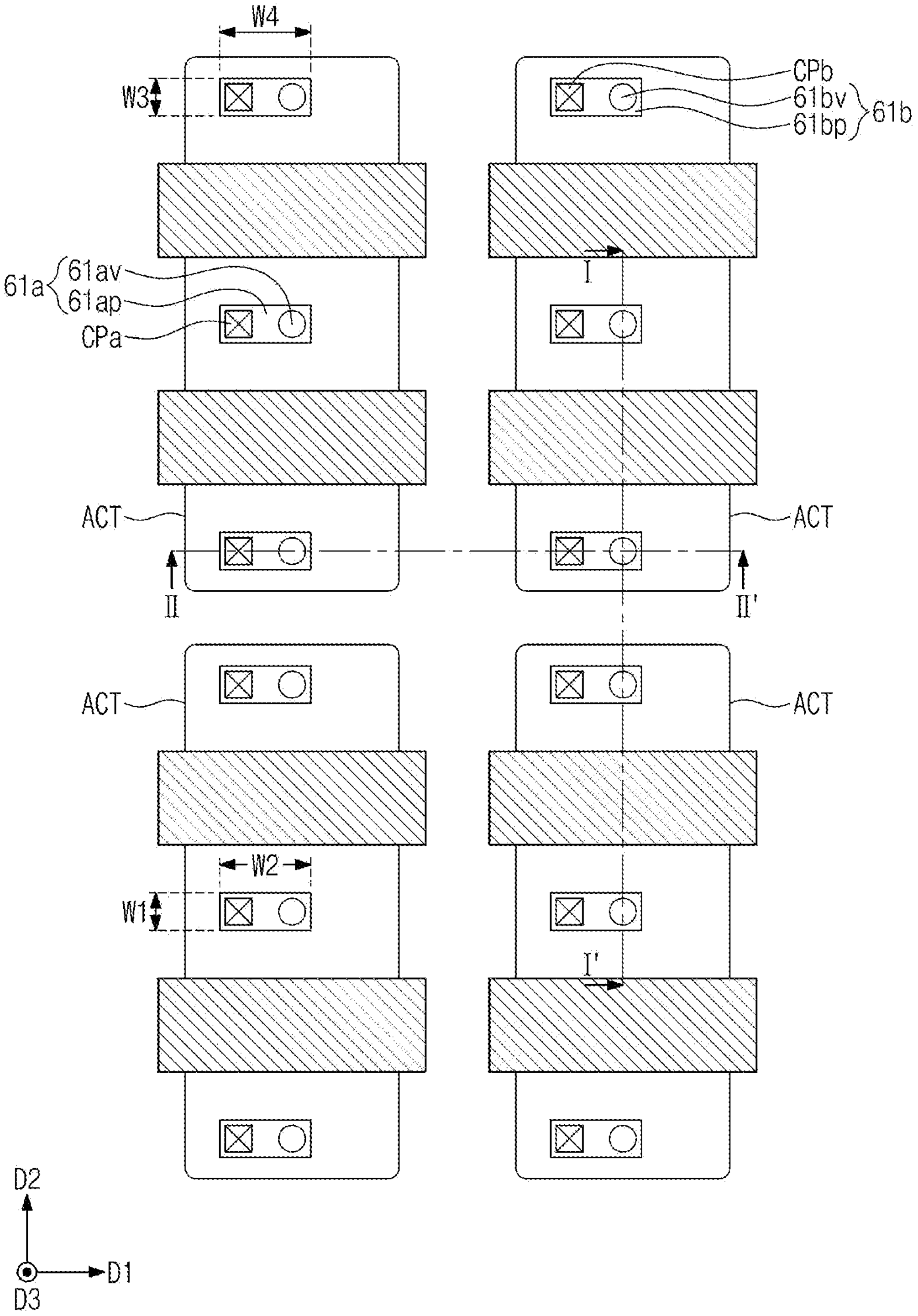
FIG. 7 illustrates a plan view partially showing a semiconductor device according to some embodiments of the present inventive concept.
Figure 8A:
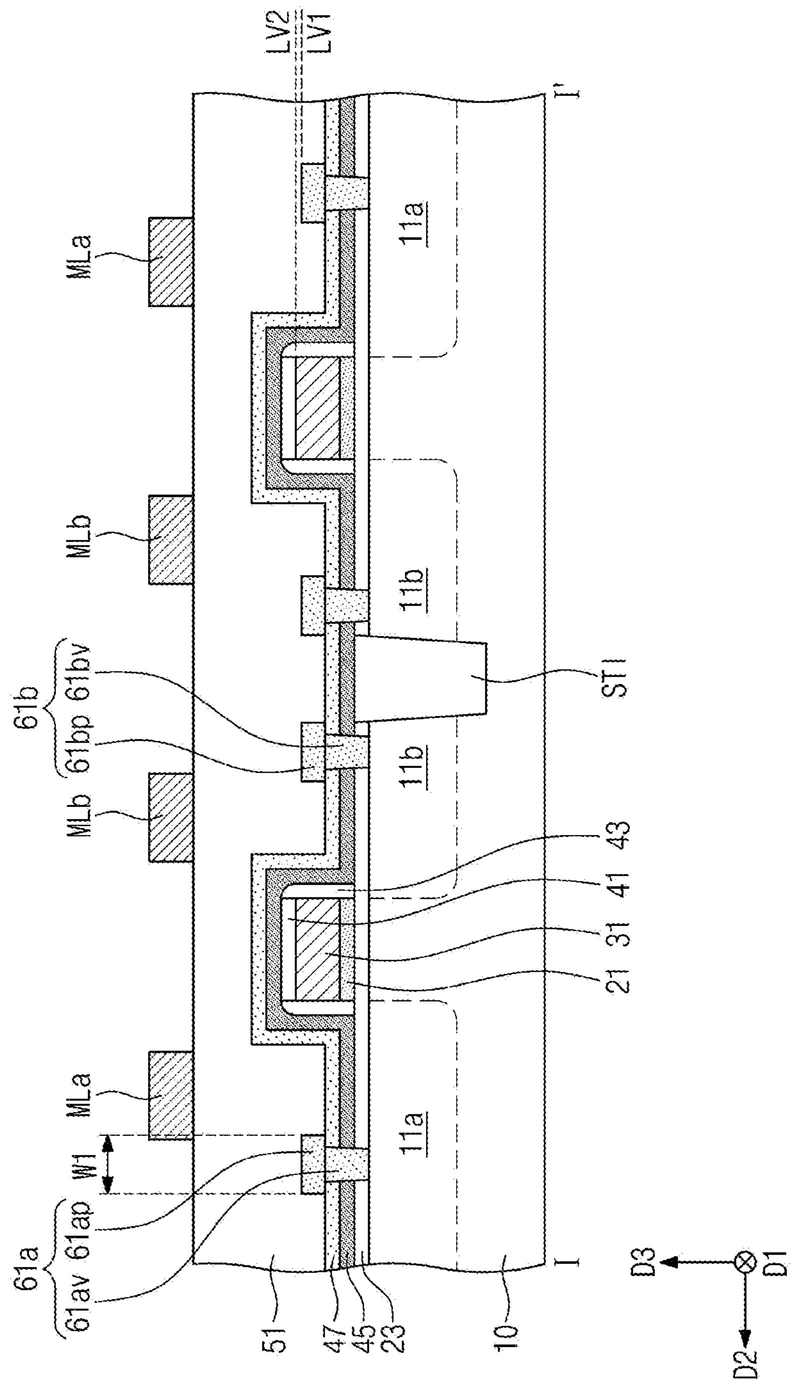
FIGS. 8A and 8B illustrate cross-sectional views respectively taken along lines I-I' and II-II' of FIG. 7, partially showing a semiconductor device according to some embodiments of the present inventive concept.
Figure 8B:
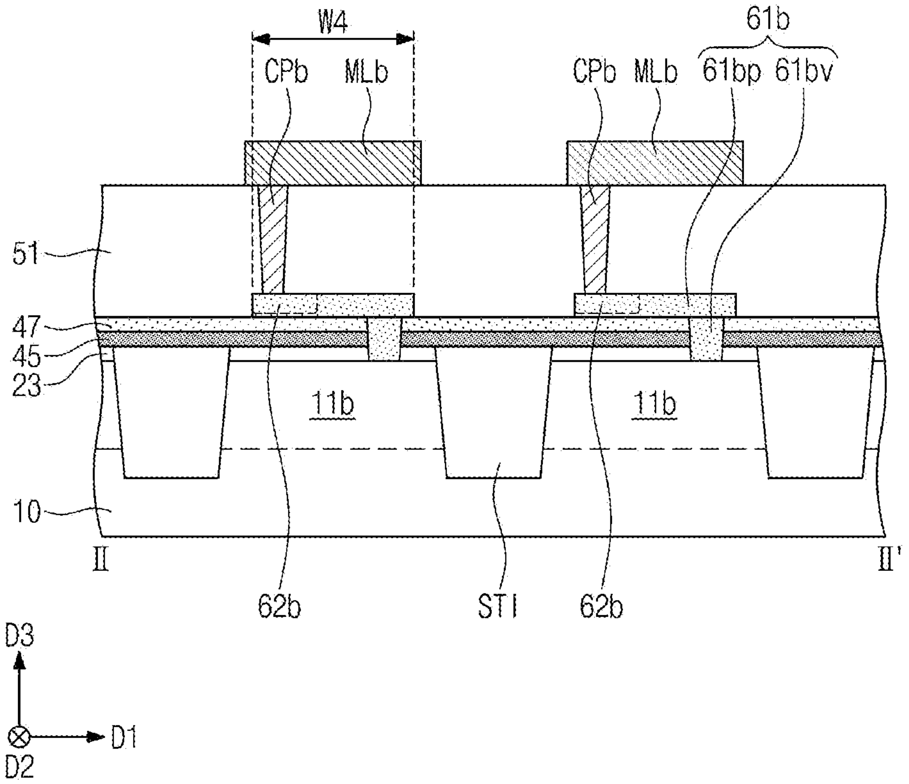

FIG. 7 illustrates a plan view partially showing a semiconductor device according to some embodiments of the present inventive concept. FIGS. 8A and 8B illustrate cross-sectional views respectively taken along lines I-I' and II-II' of FIG. 7, partially showing a semiconductor device according to some embodiments of the present inventive concept.

Referring to FIGS. 7, 8A, and 8B, a semiconductor substrate 10 may be provided therein with a device isolation layer ST1 that defines active region.

The semiconductor substrate 10 may be one of a semiconductor material (e.g., a silicon wafer), a dielectric material (e.g., glass), and a semiconductor or a conductor covered with a dielectric material. The semiconductor substrate 10 may be, for example, a silicon substrate, a germanium substrate, a silicon-on-insulator (SOI) substrate, or a germanium-on-insulator (GOI) substrate. For example, the semiconductor substrate 10 may be a silicon wafer having a first conductivity type.

The semiconductor substrate 10 may include an n-type or p-type well impurity layer, and the device isolation layer ST1 may be provided in the well impurity layer. The device isolation layer ST1 may be formed of a dielectric material.

The active regions ACT defined by the device isolation layer ST1 may be two-dimensionally arranged along a first direction D1 and a second direction D2 that intersect each other. For example, each of the active regions ACT may have a bar shape when viewed in a plan. Each of the active regions ACT may have a minor axis in the first direction D1 and a major axis in the second direction D2. For example, each of the active regions ACT may be elongated in the second direction D2. Each of the active regions ACT may have a certain length in a direction of the major axis thereof and a certain width in a direction of the minor axis thereof. A shape and arrangement of the active regions ACT may be variously changed.

In this description, the first direction D1 may indicate a direction parallel to a top surface of the semiconductor substrate 10, and the second direction D2 may denote a direction that is parallel to the top surface of the semiconductor substrate 10 and intersects the first direction D1.

A gate electrode 31 and a gate capping pattern 41 may be sequentially stacked on the active region ACT of the semiconductor substrate 10. In an embodiment, a pair of gate electrodes 31 may be disposed on each active region ACT. The gate electrode 31 may include, for example, doped polysilicon, metal, conductive metal nitride, conductive metal silicide, conductive metal oxide, or any combination thereof. The gate electrode 31 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concept is not limited thereto. The gate electrode 31 may include a single or multiple layer formed of the materials mentioned above. For example, the gate electrode 31 may include one or more of a doped polysilicon pattern, a metal silicide pattern, and a metal pattern. The gate capping pattern 41 may include one or more of a silicon oxide layer, a silicon nitride layer, a silicon oxynitride layer, and a low-k dielectric layer.

A gate dielectric pattern 21 may be disposed between the gate electrode 31 and the semiconductor substrate 10. The gate dielectric pattern 21 may have the same width as that of the gate electrode 31. The gate dielectric pattern 21 may be formed of a silicon oxide layer, a silicon oxynitride layer, a high-k dielectric layer whose dielectric constant is greater than that of a silicon oxide layer, or any combination thereof. The high-k dielectric layer may be formed of metal oxide or metal oxynitride. For example, the high-k dielectric layer used as the gate dielectric pattern 21 may be formed of $HfO_2$, HfSiO, HfSiON, HfTaO, HfTiO, HfZrO, $ZrO_2$, $Al_2O_3$, or any combination thereof, but the present inventive concept is not limited thereto.

Each active region ACT may be provided therein with drain regions 11*b* that are spaced apart from each other. Each active region ACT may be provided therein with a source region 11*a* spaced apart from the drain regions 11*b*. The source region 11*a* may be provided in the active region ACT between a pair of gate electrodes 31.

When the well impurity layer in the semiconductor substrate 10 includes impurities having a first conductivity type, the source and drain regions 11*a* and 11*b* may include impurities having a second conductivity type. Portions of the source and drain regions 11*a* and 11*b* may overlap the gate dielectric pattern 21. In some embodiments, it is illustrated by way of example that the source and drain regions 11*a* and 11*b* are provided in the active regions ACT, but the source and drain regions 11*a* and 11*b* may be omitted.

A gate spacer 43 may be disposed to cover opposite lateral surfaces of each of the gate electrode 31 and the gate capping pattern 41. The gate spacer 43 may partially cover a top surface or a side surface of the gate dielectric pattern 21. The gate spacer 43 may include silicon oxide.

A lower oxide layer 23 may be disposed on the semiconductor substrate 10. The lower oxide layer 23 may be interposed between the semiconductor substrate 10 and the gate dielectric pattern 21. The lower oxide layer 23 may cover the top surface of the semiconductor substrate 10. The lower oxide layer 23 may cover the source and drain regions 11*a* and 11*b*. The lower oxide layer 23 may be in direct contact with the top surface of the semiconductor substrate 10. The lower oxide layer 23 may include silicon oxide.

A first dielectric pattern 45 may be disposed to cover the gate capping pattern 41 and the gate spacer 43. The first dielectric pattern 45 may extend along a lateral surface of the gate spacer 43 toward and along the top surface of the gate capping pattern 41, and may further extend in the first and second directions D1 and D2 to cover a top surface of the lower oxide layer 23. The first dielectric pattern 45 may have a substantially uniform thickness. The first dielectric pattern 45 may include at least one selected from silicon nitride and silicon oxynitride.

A second dielectric pattern 47 may be disposed on the first dielectric pattern 45. The second dielectric pattern 47 may extend in the first and second directions D1 and D2 to cover a top surface of the first dielectric pattern 45. The second dielectric pattern 47 may have a substantially uniform thickness. The second dielectric pattern 47 may include silicon oxide.

First and second semiconductor patterns 61*a* and 61*b* may be disposed on the semiconductor substrate 10 on opposite sides of each of the gate electrodes 31. The first semiconductor pattern 61*a* may be disposed on a portion of the source region 11*a*, and the second semiconductor pattern 61*b* may be disposed on portions of the drain regions 11*b*. The first and second semiconductor patterns 61*a* and 61*b* may have their bottom surfaces in contact with the top surface of the semiconductor substrate 10.

The first semiconductor pattern 61*a* may include a first via part 61*av* and a first plate part 61*ap* on the first via part 61*av*. The first via part 61*av* may extend in a third direction D3 to penetrate the lower oxide layer 23, the first dielectric pattern 45, and the second dielectric pattern 47. The first via part 61*av* may be in contact with the source region 11*a*. For example, the first via part 61*av* may be in direct contact with a top surface of the source region 11*a*.

In this description, the third direction D3 may refer to a direction that is perpendicular to the top surface of the semiconductor substrate 10 and intersects the first and second directions D1 and D2.

The first plate part 61*ap* may be disposed on the first via part 61*av*. The first plate part 61*ap* may be in direct contact with the first via part 61*av*. The first plate part 61*ap* may extend in the first direction D1 on the second dielectric pattern 47. The first plate part 61*ap* may have a major axis and a minor axis. For example, the first plate part 61*ap* may have a minor axis in the second direction D2. The first plate part 61*ap* may have a first width W1 in the second direction D2. The first width W1 may be a length in a direction of the minor axis of the first plate part 61*ap*. For example, the first plate part 61*ap* may have a major axis in the first direction D1. The first plate part 61*ap* may have a second width W2 in the first direction D1. The second width W2 may be a length in a direction of the major axis of the first plate part 61*ap*. The first width W1 may be less than the second width W2.

The first plate part 61*ap* and the first via part 61*av* may be integrally formed into a single unitary body. For example, an invisible boundary may be provided between the first plate part 61*ap* and the first via part 61*av*. The present inventive concept, however, is not limited thereto, and a visible boundary may be provided between the first plate part 61*ap* and the first via part 61*av*.

The second semiconductor pattern 61*b* may include a second via part 61*bv* and a second plate part 61*bp* on the second via part 61*bv*. The second via part 61*bv* may extend in the second direction D2 to penetrate the lower oxide layer 23, the first dielectric pattern 45, and the second dielectric pattern 47. The second via part 61*bv* may be in contact with the drain region 11*b*. For example, the second via part 611*b* may be in direct contact with the drain region 11*b*.

The second plate part 61*bp* may be provided on the second via part 61*bv*. The second plate part 61*bp* may be in direct contact with the second via part 61*bv*. The second plate part 61*bp* may extend in the first direction D1 on the second dielectric pattern 47. The second plate part 61*bp* may have a major axis and a minor axis. For example, the second plate part 61*bp* may have a minor axis in the second direction D2. The second plate part 61*bp* may have a third width W3 in the second direction D2. The third width W3 may be a length in a direction of the minor axis of the second plate part 61*bp*. For example, the second plate part 61*bp* may have a major axis in the first direction D1. The second plate part 61*bp* may have a fourth width W4 in the first direction D1. The fourth width W4 may be a length in a direction of the major axis of the second plate part 61*bp*. The third width W3 may be less than the fourth width W4.

The second plate part 61*bp* and the second via part 61*bv* may be integrally formed into a single unitary body. For example, an invisible boundary may be provided between the second plate part 61*bp* and the second via part 61*bv*. The present inventive concept, however, is not limited thereto, and a visible boundary may be provided between the second plate part 61*bp* and the second via part 61*bv*.

The first and second semiconductor patterns 61*a* and 61*b* (or the first and second plate parts 61*ap* and 61*bp*) may have their top surfaces located at a first level LV1. The first level LV1 may be a vertical height from the top surface of the semiconductor substrate 10 to the top surfaces of the first and second semiconductor patterns 61*a* and 61*b*. The gate electrode 31 may have a top surface located at a second level LV2. The second level LV2 may be a vertical height from the top surface of the semiconductor substrate 10 to the top surface of the gate electrode 31. The first level LV1 may be lower than the second level LV2.

The first and second semiconductor patterns 61*a* and 61*b* may include impurities having a first conductivity type or a second conductivity type. When the well impurity layer in the semiconductor substrate 10 includes impurities having a first conductivity type, the first and second semiconductor patterns 61*a* and 61*b* may include impurities having a second conductivity type. The first semiconductor pattern 61*a* may have an impurity concentration substantially the same as that of the source region 11*a*, and the second semiconductor pattern 61*b* may have an impurity concentration substantially the same as that of the drain region 11*b*. In this description, the phrase "substantially the same" may include an allowed process error range.

The first and second semiconductor patterns 61*a* and 61*b* may include silicon (Si), germanium (Ge), silicon-germanium (SiGe), silicon carbide (SiC), or any mixture thereof. The first and second semiconductor patterns 61*a* and 61*b* may have at least one selected from a nanocrystalline structure and a polycrystalline structure.

The first and second semiconductor patterns 61*a* and 61*b* may be laterally spaced apart from the gate electrodes 31. For example, the first and second semiconductor patterns 61*a* and 61*b* may be located on opposite sides of one of the gate electrodes 31. The second semiconductor pattern 61*b* may be closer to the device isolation layer ST1 than the gate electrodes 31. An interval between the gate electrode 31 and the first semiconductor pattern 61*a* may be substantially the same as that between the gate electrode 31 and the second semiconductor pattern 61*b*. For example, the first and second semiconductor patterns 61*a* and 61*b* may be disposed symmetrical to each other about the gate electrode 31.

A first lower interlayer dielectric layer 51 may be disposed to cover the second dielectric pattern 47. The first lower interlayer dielectric layer 51 may cover the top surfaces of the first and second semiconductor patterns 61*a* and 61*b* (or the top surfaces of the first and second plate parts 61*ap* and 61*bp*). The first lower interlayer dielectric layer 51 may include one or more of a silicon oxide layer, a silicon nitride layer, a silicon oxynitride layer, and a low-k dielectric layer.

A first contact plug CPa may penetrate the first lower interlayer dielectric layer 51 to contact a portion of the first plate part 61*ap* included in the first semiconductor pattern 61*a*. When viewed in a plan, the first contact plug CPa may be laterally spaced apart from the first via part 61*av*. A metal silicide layer may be interposed between the first semiconductor pattern 61*a* and the first contact plug CPa.

The first semiconductor pattern 61*a* may be provided with a first contact region (see 62*a* of FIG. 12A) in a portion of the first plate part 61*ap*. The first contact region 62*a* may overlap the first contact plug CPa. The first contact region 62*a* may have an impurity concentration greater than that of the source region 11*a*. The impurity concentration of the first contact region 62*a* may be greater than that of any portion of the first semiconductor pattern 61*a* other than the first contact region 62*a*.

A second contact plug CPb may penetrate the first lower interlayer dielectric layer 51 to contact a portion of the second plate part 61*bp* of the second semiconductor pattern 61*b*. For example, the second contact plug CPb may directly contact a top portion of the second plate part 61*bp*. When viewed in a plan, the second contact plug CPb may be laterally spaced apart from the second via part 61*bv*. A metal silicide layer may be interposed between the second contact plug CPb and the second semiconductor pattern 61*b*.

The second semiconductor pattern 61*b* may be provided with a second contact region 62*b* in a portion of the second plate part 61*bp*. The second contact region 62*b* may overlap the second contact plug CPb. The second contact region 62*b* may have an impurity concentration greater than that of the drain region 11*b*. The impurity concentration of the second contact region 62*b* may be greater than that of any portion of the second semiconductor pattern 61*b* other than the second contact region 62*b*.

On the first lower interlayer dielectric layer 51, a first peripheral conductive line MLa may be connected to the first contact plugs CPa, and a second peripheral conductive line MLb may be connected to the second contact plugs CPb.

In some embodiments, transistors including the first and second semiconductor patterns 61*a* and 61*b* may be high-voltage transistors each having a high junction breakdown voltage equal to or greater than about 20 V. In some embodiments, the first semiconductor pattern 61*a* may be provided as a source terminal of a high-voltage transistor, and the second semiconductor pattern 61*b* may be provided as a drain terminal of a high-voltage transistor.

According to some embodiments of the present inventive concept, a semiconductor device may include the first and second semiconductor patterns 61*a* and 61*b* on opposite sides of the gate electrode 31. The first semiconductor pattern 61*a* may include the first via part 61*av* and the first plate part 61*ap* on the first via part 61*av*, and the second semiconductor pattern 61*b* may include the second via part 61*bv* and the second plate part 61*bp* on the second via part 61*bv*. The first and second plate parts 61*ap* and 61*bp* may each have a major axis and a minor axis, and when viewed in a plan, the first and second contact plugs CPa and CPb coupled to the first and second semiconductor patterns 61*a* and 61*b* may be spaced apart from the first and second via parts 61*av* and 61*bv*. Therefore, when transistors operate, increased current paths nay be provided between sources and drains thereof, and as a result, junction breakdown voltages may increase. Accordingly, a semiconductor device may have improved reliability and increased integration.

Figure 9:
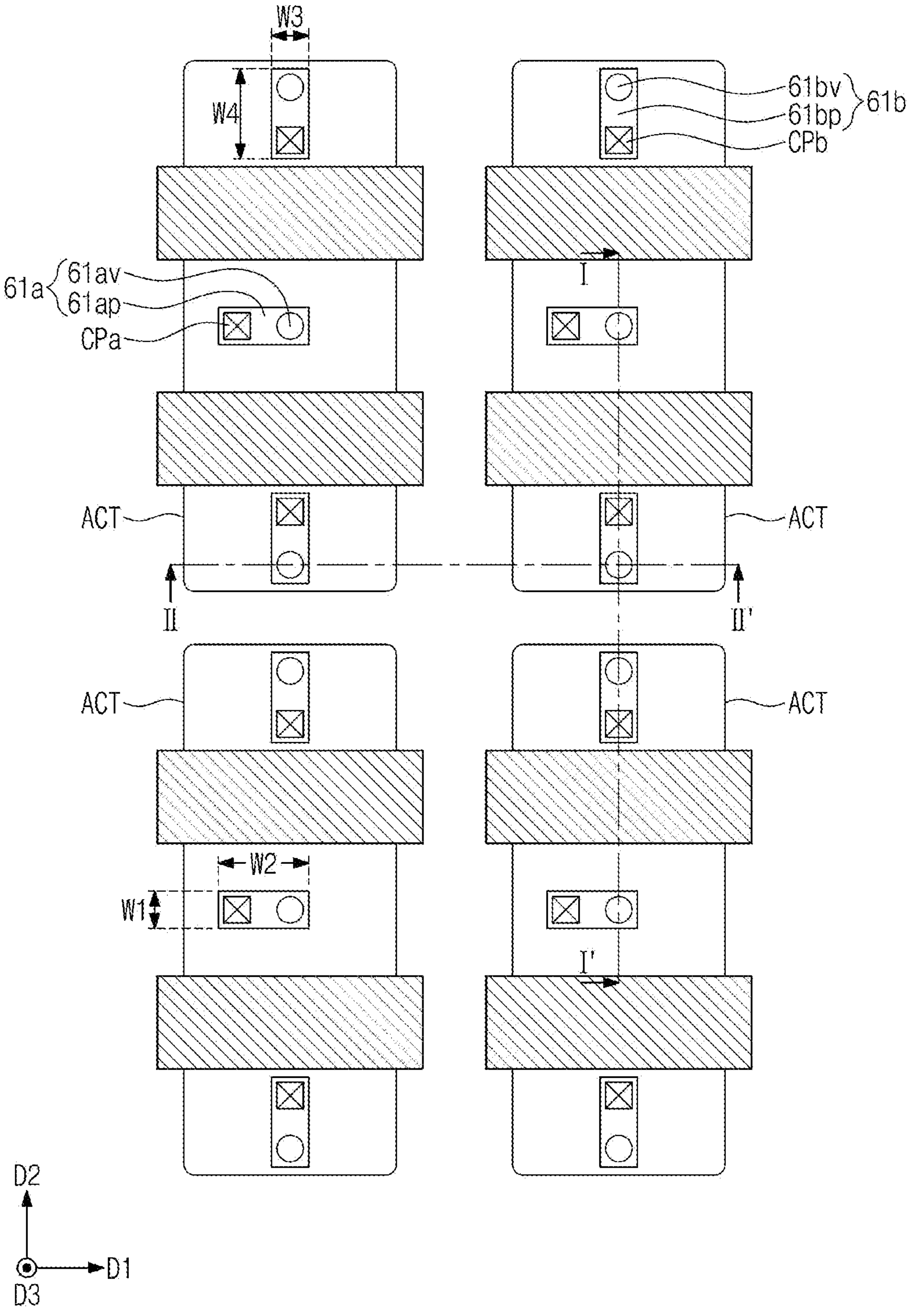
FIG. 9 illustrates a plan view partially showing a semiconductor device according to some embodiments of the present inventive concept.
Figure 10A:
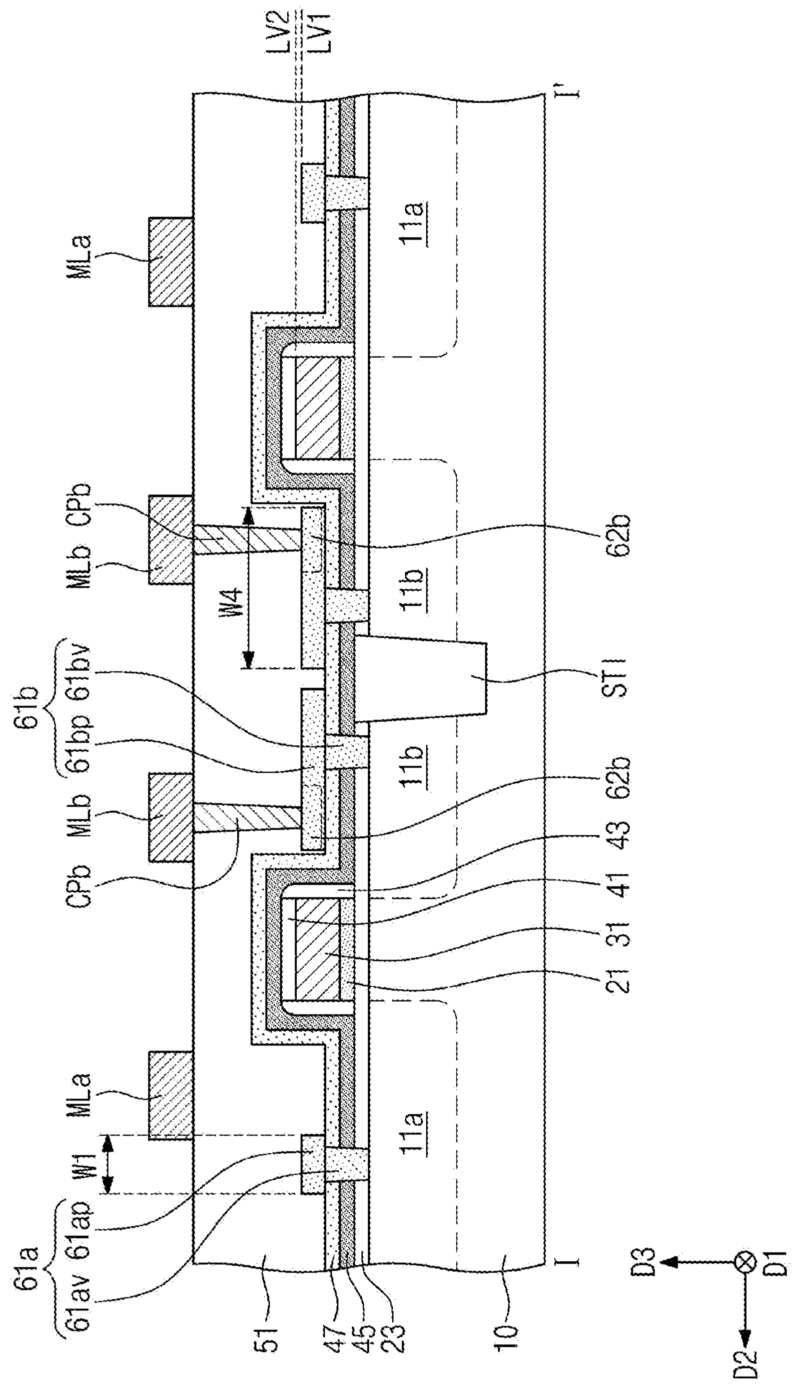
FIGS. 10A and 10B illustrate cross-sectional views respectively taken along lines I-I' and II-II' of FIG. 9, partially showing a semiconductor device according to some embodiments of the present inventive concept.
Figure 10B:
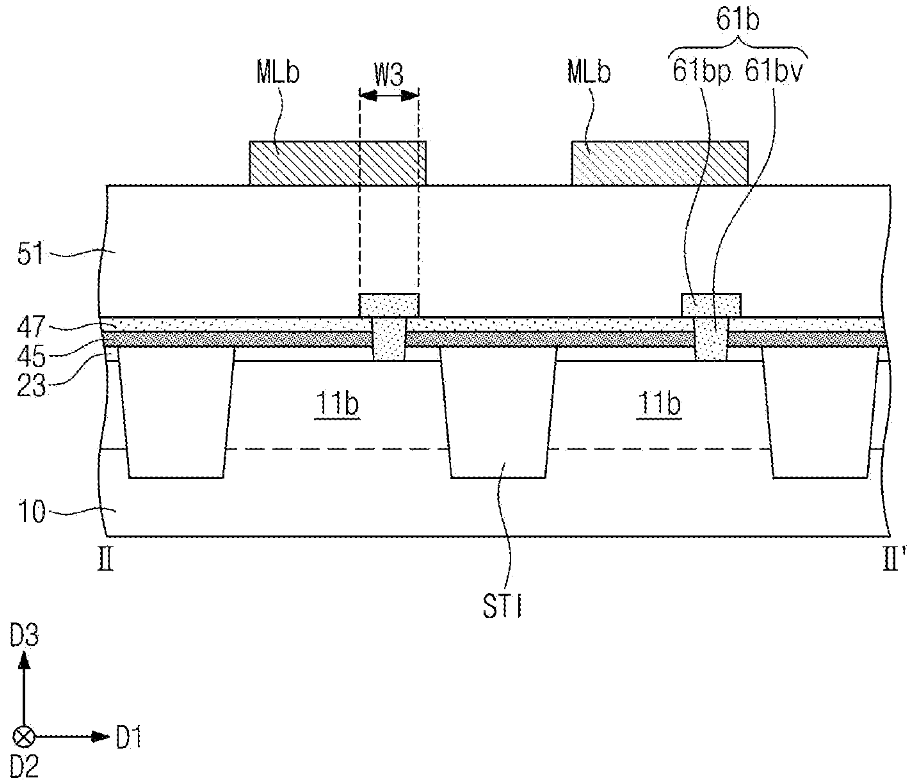

FIG. 9 illustrates a plan view partially showing a semiconductor device according to some embodiments of the present inventive concept. FIGS. 10A and 10B illustrate cross-sectional views respectively taken along lines I-I' and II-II' of FIG. 9, partially showing a semiconductor device according to some embodiments of the present inventive concept. For brevity of description, a detailed description of technical features the same as those of the semiconductor device discussed above with reference to FIGS. 7, 8A, and 8B will be omitted, and a difference thereof will explained.

Referring to FIGS. 9, 10A, and 10B, the second plate part 61*bp* may have a minor axis in the first direction D1. The second plate part 61*bp* may have a third width W3 in the first direction D1. The third width W3 may be a length in a direction of the minor axis of the second plate part 61*bp*. The second plate part 61*bp* may have a major axis in the second direction D2. The second plate part 61*bp* may have a fourth width W4 in the second direction D2. The fourth width W4 may be a length in a direction of the major axis of the second plate part 61*bp*. The third width W3 may be less than the fourth width W4. In this case, directions of the major and minor axes of the second plate part 61*bp* may be different from those of the major and minor axes of the second plate part 61*bp* depicted in FIGS. 7, 8A, and 8B.

An interval between the gate electrode 31 and the first semiconductor pattern 61*a* may be greater than that between the gate electrode 31 and the second semiconductor pattern 61*b*. In other words, the second semiconductor pattern 61*b* may be closer to the gate electrode 31 than the first semiconductor pattern 61*a*. For example, the first and second semiconductor patterns 61*a* and 61*b* may be disposed asymmetrical to each other about the gate electrode 31.

The second contact plug CPb may be closer to the gate electrode 31 than the second via part 61*bv*. Alternatively, the second via part 61*bv* may be closer to the gate electrode 31 than the second contact plug CPb.

Figure 11:
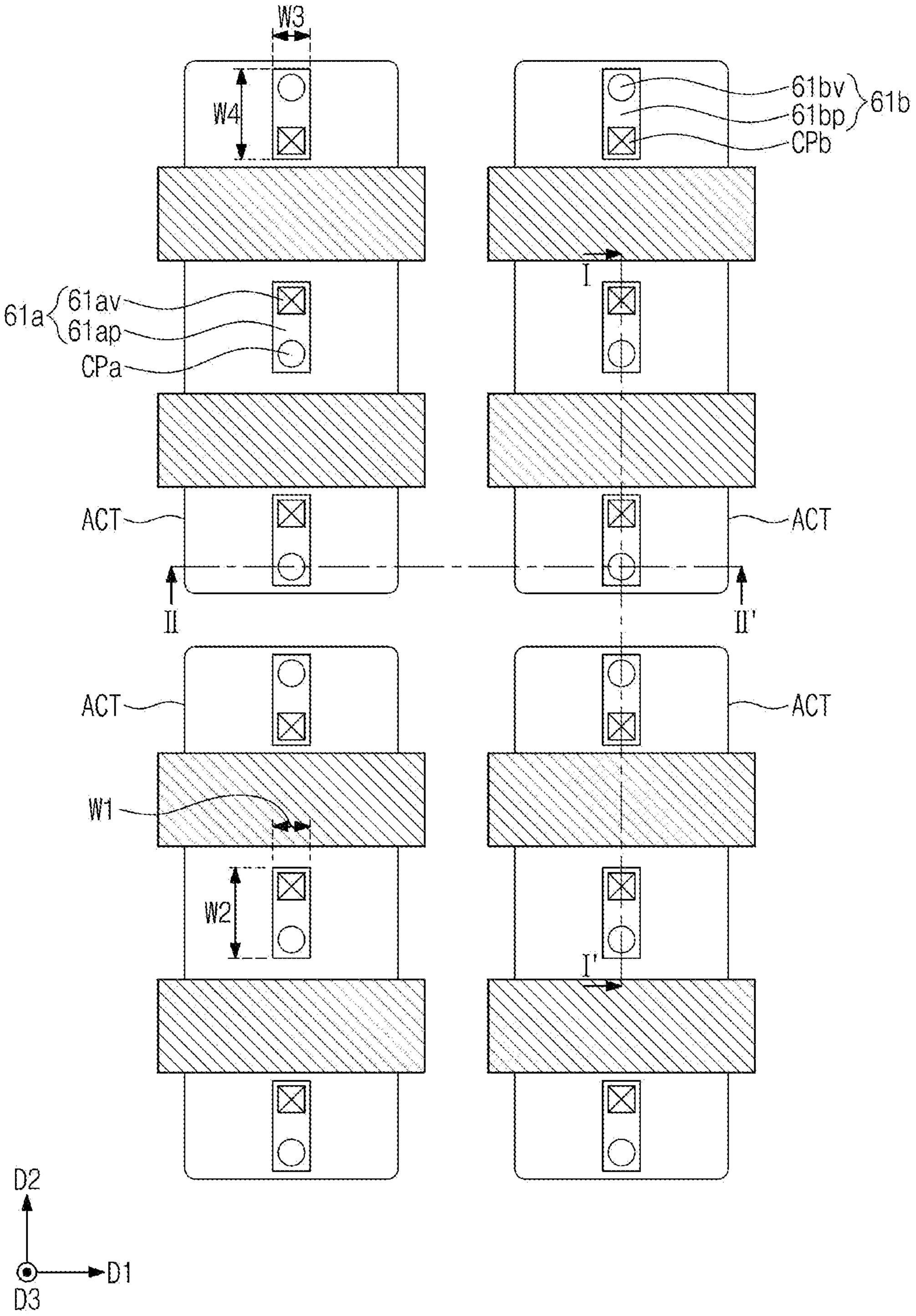
FIG. 11 illustrates a plan view partially showing a semiconductor device according to some embodiments of the present inventive concept.
Figure 12A:
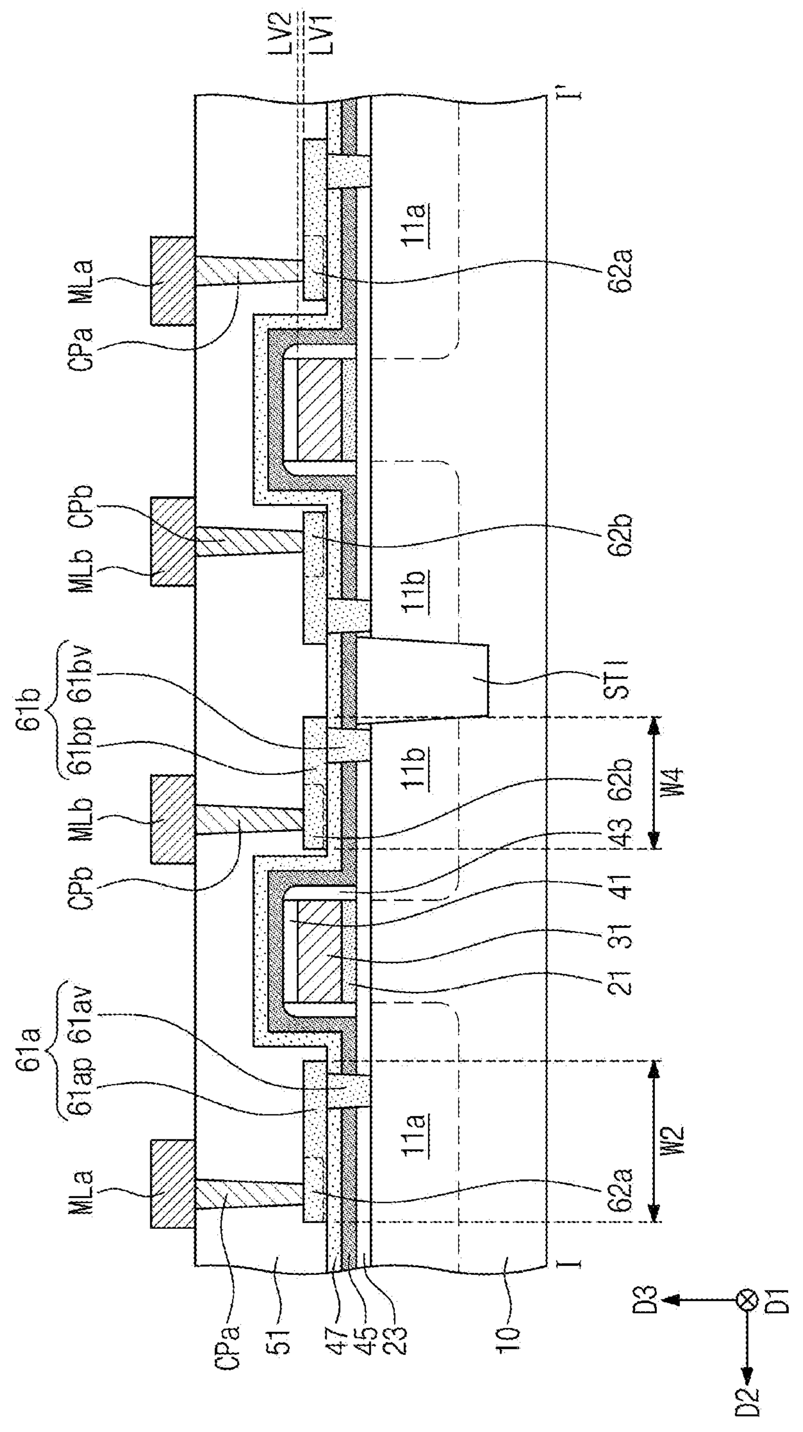
FIGS. 12A and 12B illustrate cross-sectional views respectively taken along lines I-I' and II-II' of FIG. 11, partially showing a semiconductor device according to some embodiments of the present inventive concept.
Figure 12B:
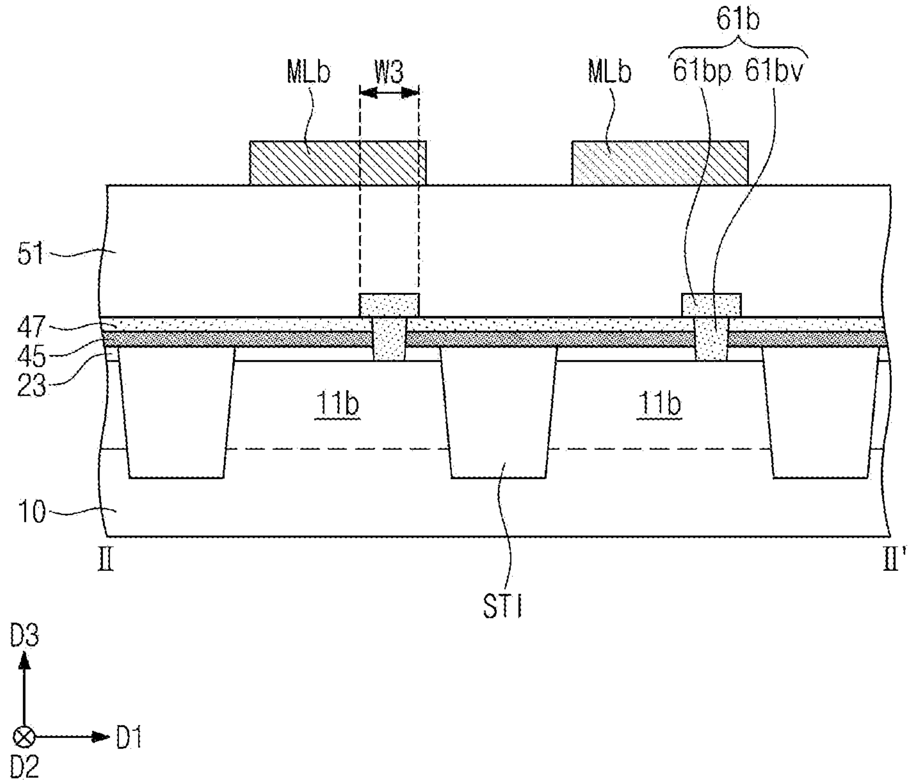

FIG. 11 illustrates a plan view partially showing a semiconductor device according to some embodiments of the present inventive concept. FIGS. 12A and 12B illustrate cross-sectional views respectively taken along lines I-I' and II-II' of FIG. 11, partially showing a semiconductor device according to some embodiments of the present inventive concept. For brevity of description, a detailed description of technical features the same as those of the semiconductor device discussed above with reference to FIGS. 7, 8A, and 8B will be omitted, and a difference thereof will explained.

Referring to FIGS. 11, 12A, and 12B, the first plate part 61*ap* may have a minor axis in the first direction D1. The first plate part 61*ap* may have a first width W1 in the first direction D1. The first width W1 may be a length in a direction of the minor axis of the first plate part 61*ap*. The first plate part 61*ap* may have a major axis in the second direction D2. The first plate part 61*ap* may have a second width W2 in the second direction D2. The second width W2 may be a length in a direction of the major axis of the first plate part 61*ap*. The first width W1 may be less than the second width W2. In this case, directions of the major and minor axes of the first plate part 61*ap* may be different from those of the major and minor axes of the first plate part 61*ap* depicted in FIGS. 7, 8A, and 8B.

The first contact plug CPa may be closer to the gate electrode 31 than the first via part 61*av*. Alternatively, the first via part 61*av* may be closer to the gate electrode 31 than the first contact plug CPa.

The second plate part 61*bp* may have a minor axis in the first direction D1. The second plate part 61*bp* may have a third width W3 in the first direction D1. The third width W3 may be a length in a direction of the minor axis of the second plate part 61*bp*. The second plate part 61*bp* may have a major axis in the second direction D2. The second plate part 61*bp* may have a fourth width W4 in the second direction D2. The fourth width W4 may be a length in a direction of the major axis of the second plate part 61*bp*. The third width W3 may be less than the fourth width W4. In this case, directions of the major and minor axes of the second plate part 61*bp* may be different from those of the major and minor axes of the second plate part 61*bp* depicted in FIGS. 7, 8A, and 8B. The direction of the major axis of the second plate part 61*bp* may be the same as that of the major axis of the first plate part 61*ap*.

The second contact plug CPb may be closer to the gate electrode 31 than the second via part 61*bv*. In this case, the second via part 61*bv* may be closer to the device isolation layer ST1 than the second contact plug CPb. Alternatively, the second via part 61*bv* may be closer to the gate electrode 31 than the second contact plug CPb.

The first via part 61*av* may be closer to the gate electrode 31 than the second via part 61*bv*. Alternatively, the second via part 61*bv* may be closer to the gate electrode 31 than the first via part 61*av*. The first contact plug CPa may be closer to the gate electrode 31 than the second contact plug CPb. Alternatively, the second contact plug CPb may be closer to the gate electrode 31 than the first contact plug CPa. Thus, the first and second semiconductor patterns 61*a* and 61*b* may be disposed asymmetrical or symmetrical to each other about the gate electrode 31.

Figure 13:
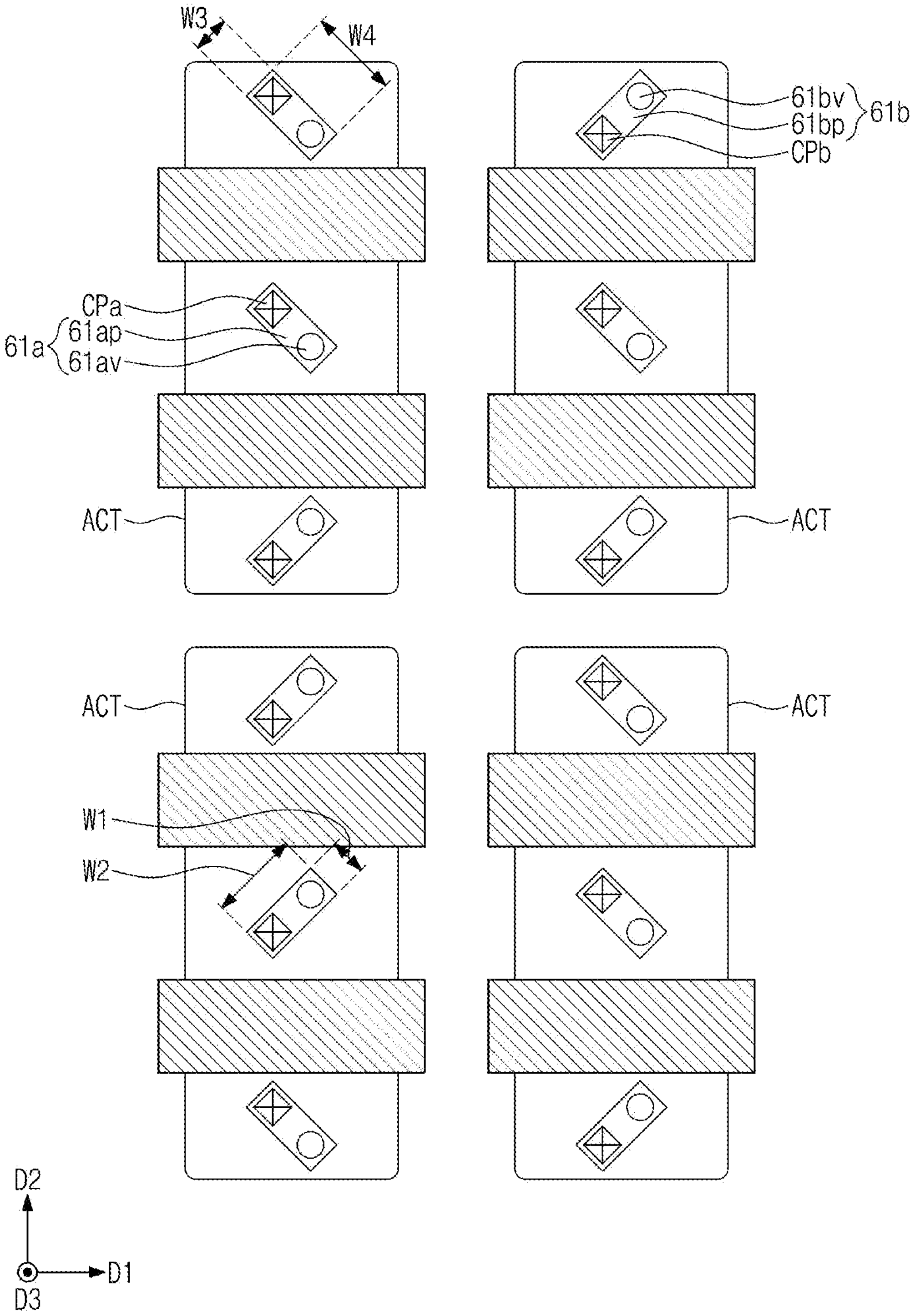
FIG. 13 illustrates a plan view partially showing a semiconductor device according to some embodiments of the present inventive concept.

FIG. 13 illustrates a plan view partially showing a semiconductor device according to some embodiments of the present inventive concept. For brevity of description, a detailed description of technical features the same as those of the semiconductor device discussed above with reference to FIGS. 7, 8A, and 8B will be omitted, and a difference thereof will explained.

A direction of a major axis of each of the first plate part 61*ap* and the second plate part 61*bp* may be any direction parallel to the top surface of the semiconductor substrate 10. For example, the first plate part 61*ap* and the second plate part 61*bp* may each have a major axis in any direction parallel to a plane defined by the first direction D1 and the second direction D2. The first contact plug CPa may be closer to or farther from the gate electrode 31 than the first via part 61*av*. The second contact plug CPb may be closer to or farther from the gate electrode 31 than the second via part 611*v*.

Figure 14A:
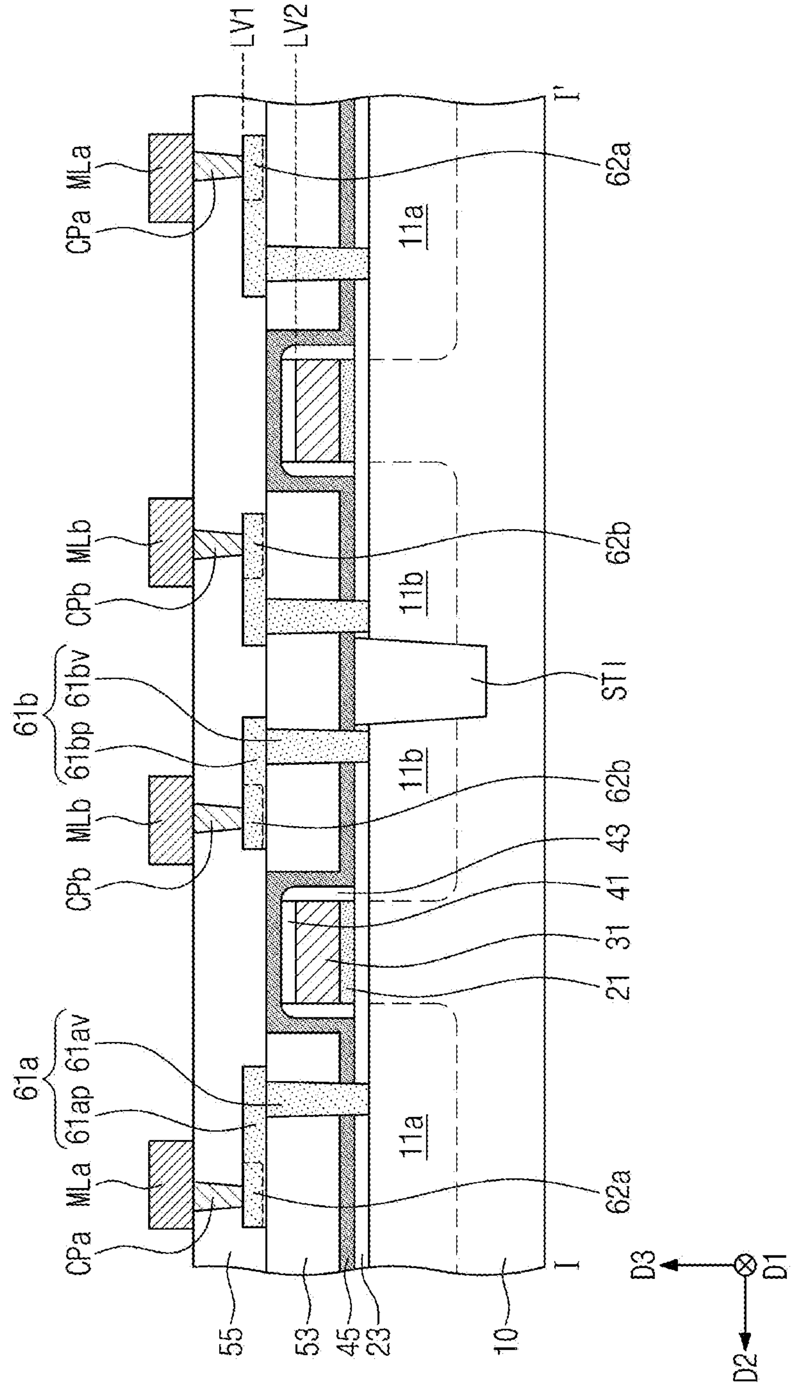
FIGS. 14A and 14B illustrate cross-sectional views respectively taken along lines I-I' and II-II' of FIG. 11, partially showing a semiconductor device according to some embodiments of the present inventive concept.
Figure 14B:
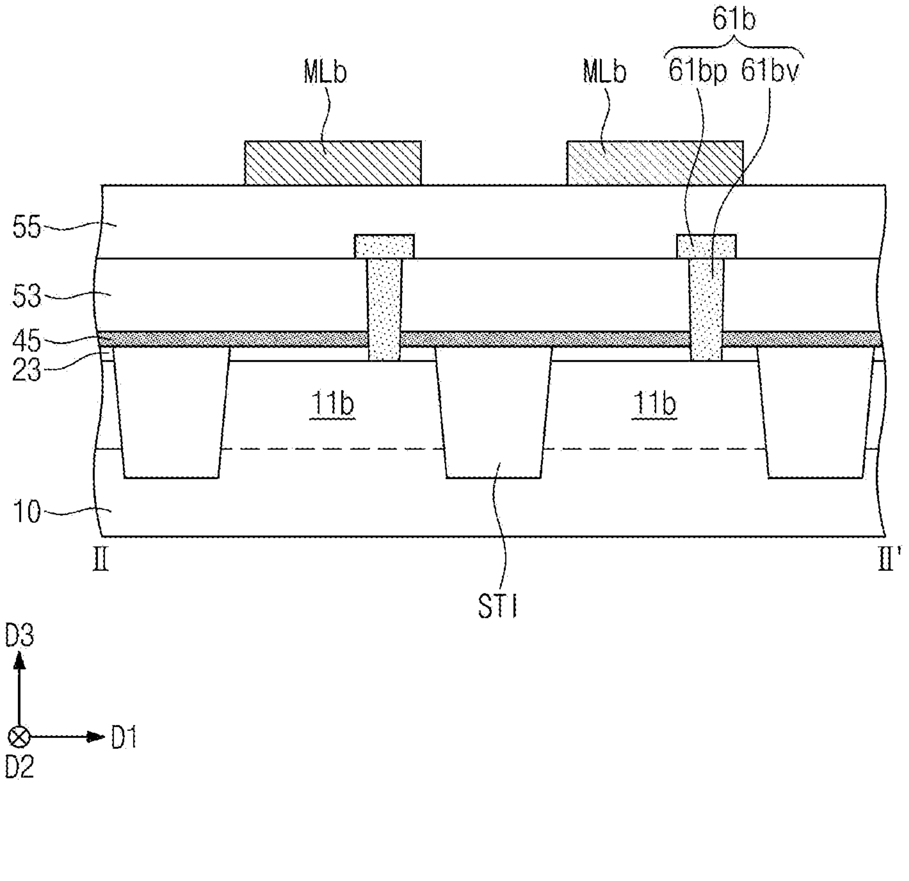

FIGS. 14A and 14B illustrate cross-sectional views respectively taken along lines I-I' and II-II' of FIG. 11, partially showing a semiconductor device according to some embodiments of the present inventive concept. For brevity of description, a detailed description of technical features the same as those of the semiconductor device discussed above with reference to FIGS. 7, 8A, and 8B will be omitted, and a difference thereof will explained.

Referring to FIGS. 14A and 141, the second dielectric pattern 47 may be omitted, and a second lower interlayer dielectric layer 53 may cover a portion of the first dielectric pattern 45. In this case, the second lower interlayer dielectric layer 53 may be in direct contact with a portion of the first dielectric pattern 45. The second lower interlayer dielectric layer 53 may not cover an uppermost surface of the first dielectric pattern 45. The uppermost surface of the first dielectric pattern 45 may be exposed from the second lower interlayer dielectric layer 53. The uppermost surface of the first dielectric pattern 45 exposed from the second lower interlayer dielectric layer 53 may overlap the gate electrode 31. A top surface of the second lower interlayer dielectric layer 53 may be coplanar with the uppermost surface of the first dielectric pattern 45.

The first via part 61*av* and the second via part 61*bv* may penetrate the second lower interlayer dielectric layer 53, the first dielectric pattern 45, and the lower oxide layer 23 to be coupled to the source region 11*a* and the drain region 11*b*, respectively.

The first plate part 61*ap* and the second plate part 61*bp* may be disposed on the second lower interlayer dielectric layer 53. The first and second semiconductor patterns 61*a* and 61*b* (or the first and second plate parts 61*ap* and 61*bp*) may have their top surfaces located at a first level LV1. The first level LV1 may be a vertical height from the top surface of the semiconductor substrate 10 to the top surfaces of the first and second semiconductor patterns 61*a* and 61*b*. The gate electrode 31 may have a top surface located at a second level LV2. The second level LV2 may be a vertical height from the top surface of the semiconductor substrate 10 to the top surface of the gate electrode 31. The first level LV1 may be higher than the second level LV2.

The first via part 61*av* and the second via part 61*bv* may have their top surfaces located at their vertical levels higher than that of the top surface of the gate electrode 31.

A third lower interlayer dielectric layer 55 may be disposed on the second lower interlayer dielectric layer 53. The third lower interlayer dielectric layer 55 may cover the first plate part 61*ap* and the second plate part 61*bp*.

The first contact plug CPa and the second contact plug CPb may penetrate the third lower interlayer dielectric layer 55 to be coupled to the first plate part 61*ap* and the second plate part 61*bp*, respectively. The first contact plug CPa and the second contact plug CPb may respectively contact the first and second contact regions 62*a* and 62*b*.

FIGS. 15A to 15G illustrate cross-sectional views showing a method of fabricating a semiconductor device according to some embodiments of the present inventive concept.

Figure 15A:
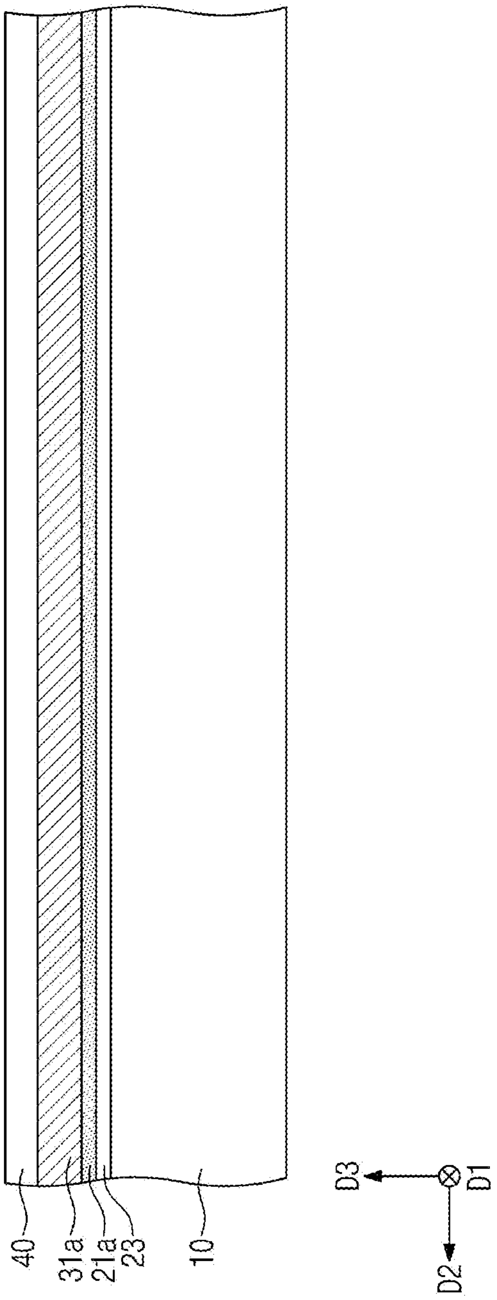
FIGS. 15A, 15B, 15C, 15D, 15E, 15E, 15F and 15G illustrate cross-sectional views showing a method of fabricating a semiconductor device according to some embodiments of the present inventive concept.

Referring to FIG. 15A, a lower oxide layer 23 may be formed to cover a top surface of a semiconductor substrate 10. A gate dielectric layer 21*a* may be formed on the lower oxide layer 23. The lower oxide layer 23 and the gate dielectric layer 21*a* may include a silicon oxide layer. The lower oxide layer 23 and the gate dielectric layer 21*a* may be formed by using a deposition process or an oxidation process.

A gate conductive layer 31*a* may be deposited having a uniform thickness on the gate dielectric layer 21*a*. The gate conductive layer 31*a* may include, for example, doped polysilicon, metal, conductive metal nitride, conductive metal silicide, conductive metal oxide, or any combination thereof. The gate conductive layer 31*a* may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concept is not limited thereto. The gate conductive layer 31*a* may include a single or multiple layer of the materials mentioned above. A dielectric material may be used to form a mask layer 40 on the gate conductive layer 31*a*. A mask layer 40 may be formed on the gate conductive layer 31*a*.

Figure 15B:
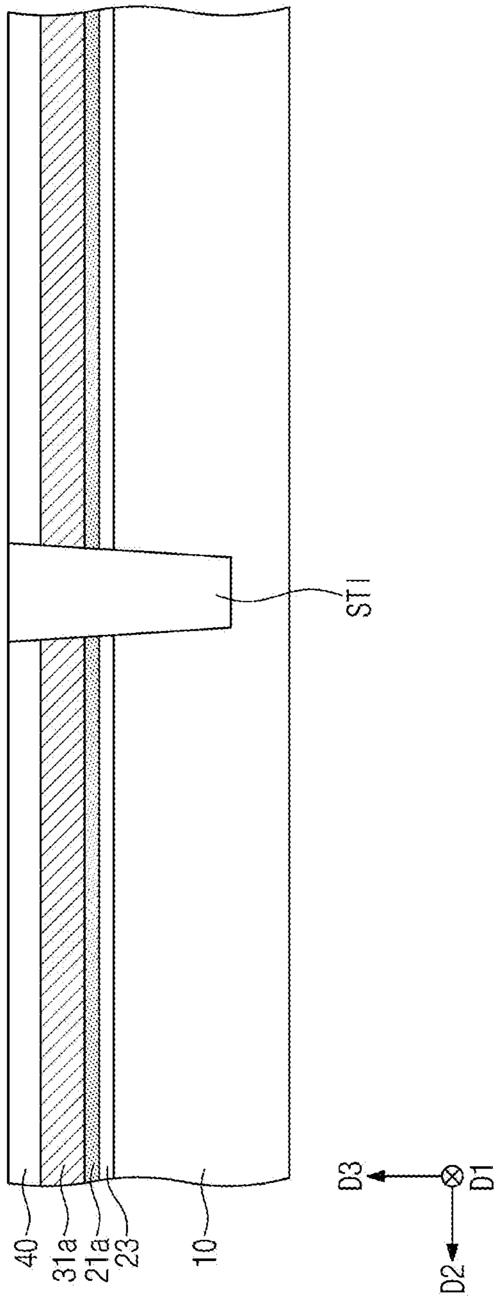

Referring to FIG. 15B, a device isolation layer ST1 may be formed which defines active regions ACT in the semiconductor substrate 10.

The formation of the device isolation layer ST1 may include forming trenches by patterning the mask layer 40, the gate conductive layer 31*a*, the gate dielectric layer 21*a*, the lower oxide layer 23, and the semiconductor substrate 10, filling the trenches with a dielectric material, and allowing the dielectric material to undergo a planarization process to expose a top surface of the gate conductive layer 31*a*. Before or during the planarization process, the mask layer 40 may be removed. As can be seen, the device isolation layer ST1 penetrates into the semiconductor substrate 10 and separates the mask layer 40, the gate conductive layer 31*a*, the gate dielectric layer 21*a*, the lower oxide layer 23.

Figure 15C:
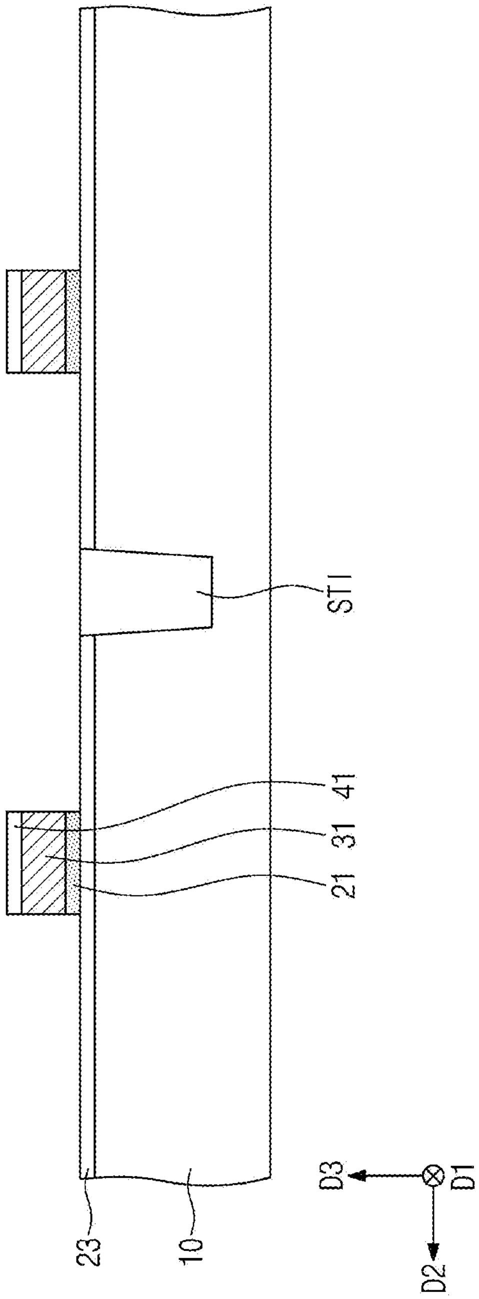

Referring to FIG. 15C, a gate capping layer may be formed on the gate conductive layer 31*a*, and then the gate capping layer, the gate conductive layer 31*a*, and the gate dielectric layer 21*a* are patterned to respectively form a gate capping pattern 41, a gate electrode 31, and a gate dielectric pattern 21. The formation of the gate capping pattern 41, the gate electrode 31, and the gate dielectric pattern 21 may include forming a hardmask pattern on the gate capping layer, using the hardmask pattern as an etching mask to anisotropically etch the gate capping layer, the gate conductive layer 31*a*, and the gate dielectric layer 21*a* to form the gate capping pattern 41, the gate electrode 31, and the gate dielectric pattern 21.

Figure 15D:
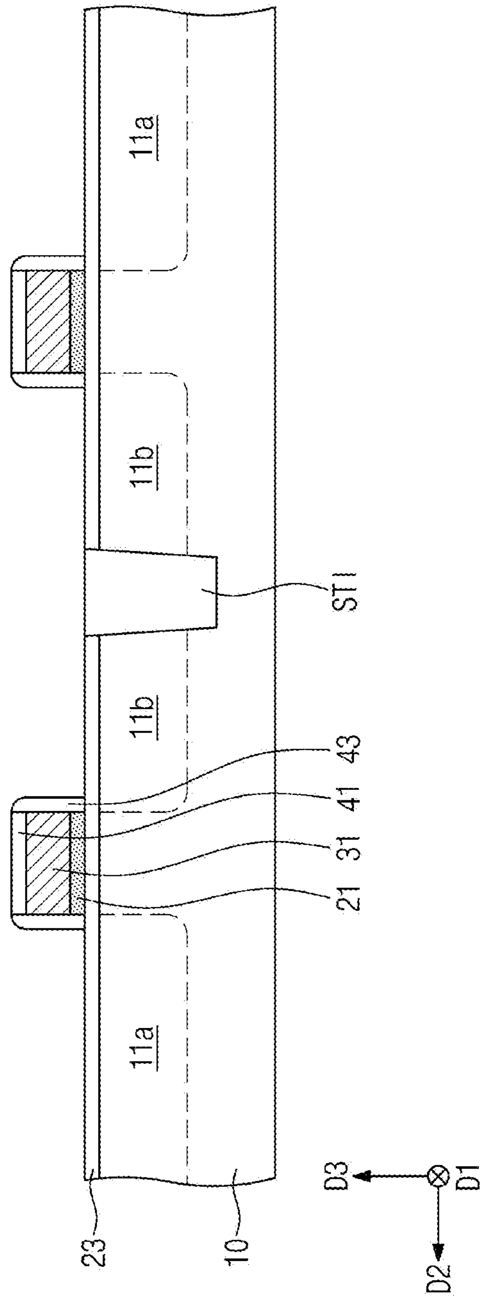

Referring to FIG. 15D, gate spacers 43 may be formed on opposite sides of the gate electrode 31. The gate spacers 43 may be positioned on the gate dielectric pattern 21.

The semiconductor substrate 10 on opposite sides of the gate electrode 31 may be doped with impurities having a first or second conductivity type to form source and drain regions 11*a* and 11*b*.

Figure 15E:
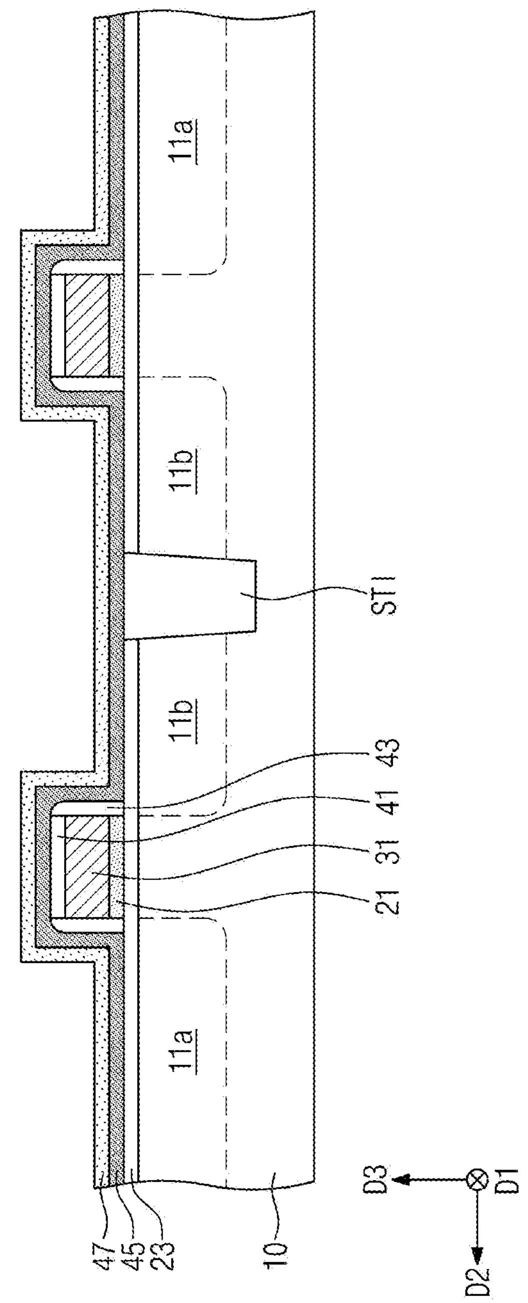

Referring to FIG. 15E, a first dielectric pattern 45 may be formed to cover the gate capping pattern 41 and the gate spacers 43. The first dielectric pattern 45 may be formed by using at least one selected from chemical vapor deposition (CVD), physical vapor deposition (PVD), and atomic layer deposition (ALD).

The first dielectric pattern 45 may extend from a lateral surface of the gate spacer 43 toward a top surface of the gate capping pattern 41. The first dielectric pattern 45 may extend in a first direction D1 and a second direction D2 on the top surface of the gate capping pattern 41, and cover a top surface of the lower oxide layer 23. The first dielectric pattern 45 may include silicon nitride.

A second dielectric pattern 47 may be formed on the first dielectric pattern 45. The second dielectric pattern 47 may be formed by using at least one selected from chemical vapor deposition (CVD), physical vapor deposition (PVD), and atomic layer deposition (ALD). The second dielectric pattern 47 may extend in the first and second directions D1 and D2 to cover a top surface of the first dielectric pattern 45.

Figure 15F:
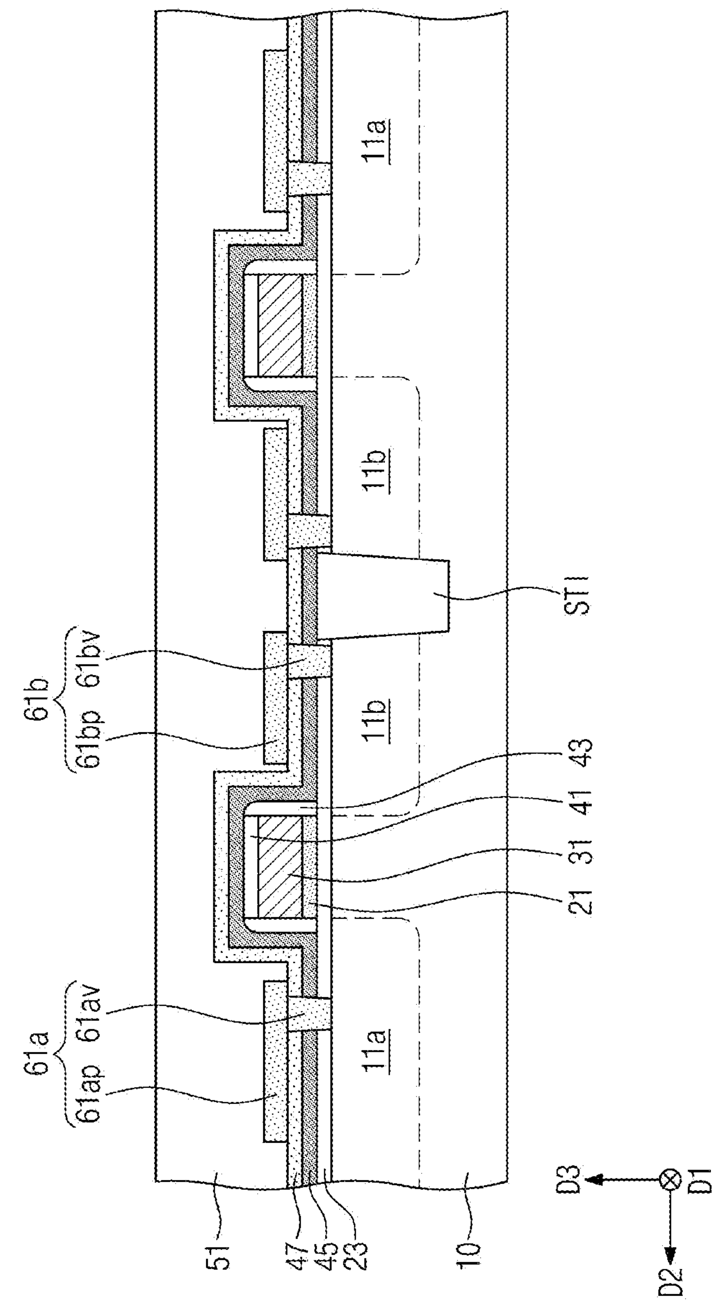

Referring to FIG. 15F, a first semiconductor pattern 61*a* and a second semiconductor pattern 61*b* may be formed. The formation of the first and second semiconductor patterns 61*a* and 61*b* may include forming openings that penetrate the second dielectric pattern 47, the first dielectric pattern 45, and the lower oxide layer 23, forming a preliminary semiconductor layer on an entire surface of the second dielectric pattern 47, and performing a patterning process on the preliminary semiconductor layer. The preliminary semiconductor layer may include germanium (Ge), silicon carbide (SiC), or any mixture thereof. The preliminary semiconductor layer may include at least one selected from a single crystalline structure and a polycrystalline structure. While the preliminary semiconductor layer is formed on the entire surface of the second dielectric pattern 47, the preliminary semiconductor layer may fill the openings. The first semiconductor pattern 61*a* may include a first via part 61*av* and a first plate part 61*ap*, and the second semiconductor pattern 61*b* may include a second via part 61*bv* and a second plate part 61*bp*.

The first plate part 61*ap* and the second plate part 61*bp* may have their top surfaces at a lower level than that of a top surface of the gate electrode 31.

A first lower interlayer dielectric layer 51 may be formed to cover a top surface of the second dielectric pattern 47. The first lower interlayer dielectric layer 51 may cover the first plate part 61*ap* and the second plate part 61*bp*.

Figure 15G:
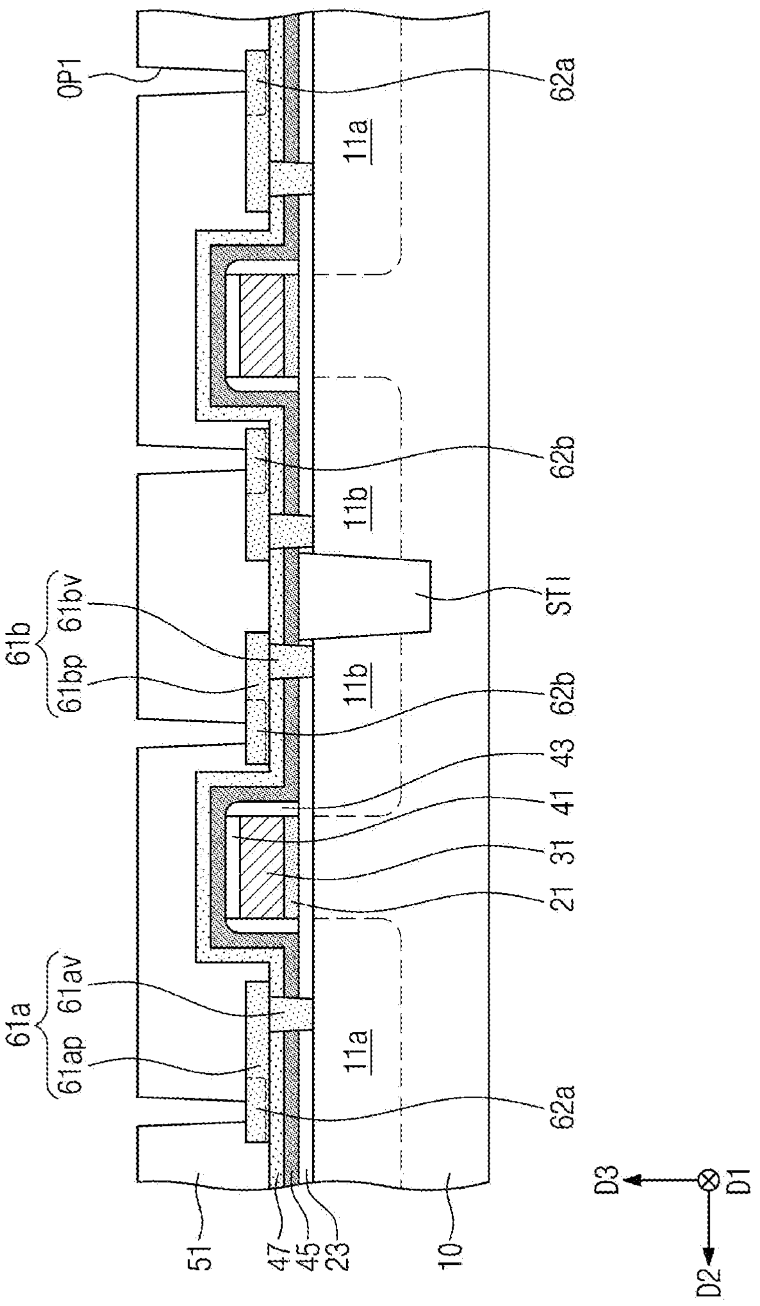

Referring to FIG. 15G, the first lower interlayer dielectric layer 51 may be patterned to form first openings OP1 that expose a portion of the first plate part 61*ap* and a portion of the second plate part 61*bp*.

The first plate part 61*ap* and the second plate part 61*bp* may be implanted with impurities having a first or second conductivity type to form a first contact region 62*a* and a second contact region 62*b*. The first contact region 62*a* may have an impurity concentration greater than that of the source region 11*a*, and the second contact region 62*b* may have an impurity concentration greater than that of the drain region 11*b*. The first and second contact regions 62*a* and 62*b* may be subsequentially used to accommodate contact plugs.

For example, referring back to FIGS. 7, 8A, and 8B, first and second contact plugs CPa and CPb may be formed which are respectively coupled to the first and second semiconductor patterns 61*a* and 61*b*, and first and second peripheral conductive lines MLa and MLb may be formed which are respectively coupled to the first and second contact plugs CPa and CPb.

Figure 16A:
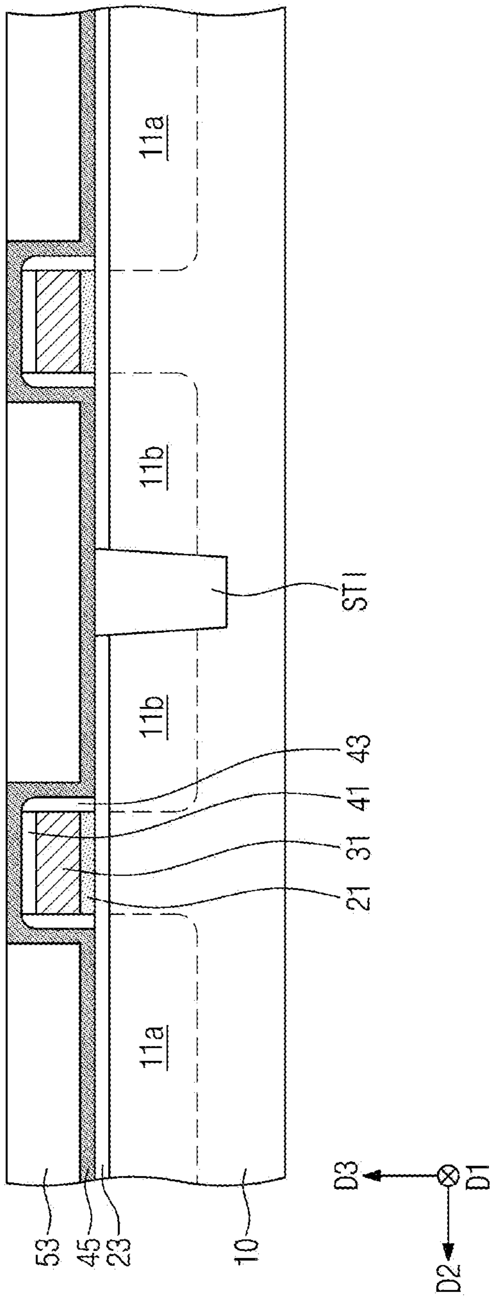
FIGS. 16A, 16B and 16C illustrate cross-sectional views showing a method of fabricating a semiconductor device according to some embodiments of the present inventive concept.
Figure 16B:
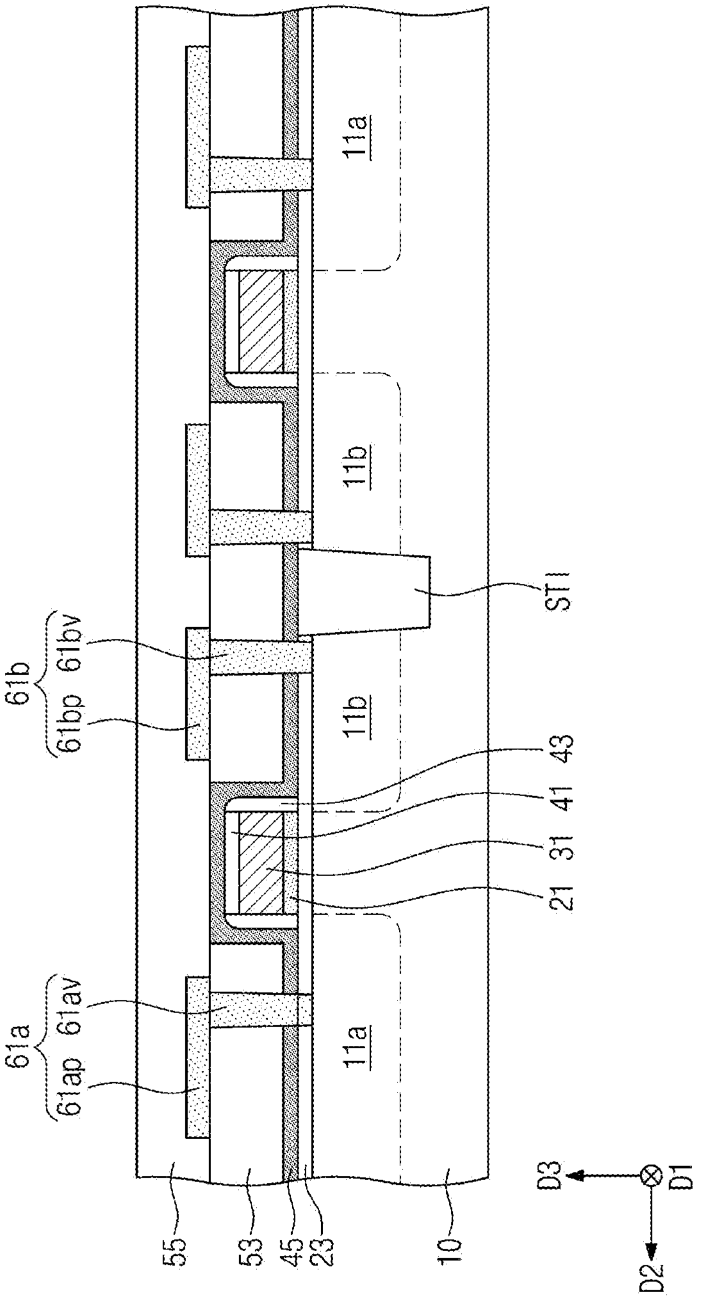
Figure 16C:
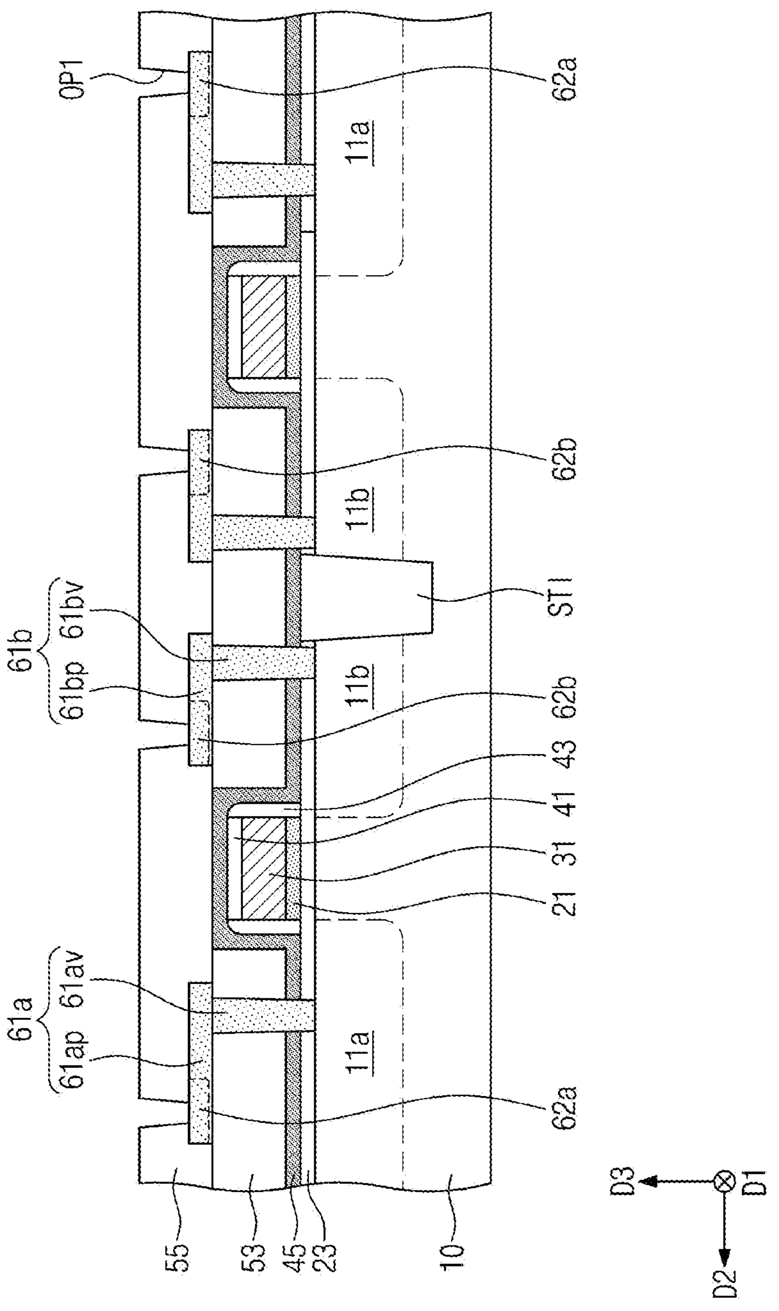

FIGS. 16A to 16C illustrate cross-sectional views show ring a method of fabricating a semiconductor device according to some embodiments of the present inventive concept.

Referring to FIG. 16A, on a resultant structure of FIG. 15D, a first dielectric pattern 45 may be formed to cover the gate capping pattern 41 and the gate spacers 43. The first dielectric pattern 45 may be formed by using at least one selected from chemical vapor deposition (CVD), physical vapor deposition (PVD), and atomic layer deposition (ALD).

The first dielectric pattern 45 may extend from a lateral surface of the gate spacer 42 toward a top surface of the gate capping pattern 41. The first dielectric pattern 45 may extend in a first direction D1 and a second direction D2 on the top surface of the gate capping pattern 41, and cover a top surface of the lower oxide layer 23. The first dielectric pattern 45 may include silicon nitride.

A second lower interlayer dielectric layer 53 may be formed to cover a portion of the first dielectric pattern 45. The formation of the second lower interlayer dielectric layer 53 may include forming a preliminary second lower interlayer dielectric layer by using at least one selected from chemical vapor deposition (CVD), physical vapor deposition (PVD), and atomic layer deposition (ALD), and using the first dielectric pattern 45 as an etch stop layer to perform a planarization process on the preliminary second lower interlayer dielectric layer.

The second lower interlayer dielectric layer 53 may not cover an uppermost surface of the first dielectric pattern 45. The uppermost surface of the first dielectric pattern 45 may be exposed from the second lower interlayer dielectric layer 53. A top surface of the second lower interlayer dielectric layer 53 may be coplanar with the uppermost surface of the first dielectric pattern 45.

Referring to FIG. 16B, a first semiconductor pattern 61*a* and a second semiconductor pattern 61*b* may be formed. The formation of the first and second semiconductor patterns 61*a* and 61*b* may include forming openings that penetrate the second lower interlayer dielectric layer 53, the first dielectric pattern 45, and the lower oxide layer 23, forming a preliminary semiconductor layer on an entire surface of the second lower interlayer dielectric layer 53, and performing a patterning process on the preliminary semiconductor layer. The preliminary semiconductor layer may include germanium (Ge), silicon carbide (SiC), or any mixture thereof. The preliminary semiconductor layer may have at least one selected from a single crystalline structure and a polycrystalline structure. While the preliminary semiconductor layer is formed on the entire surface of the second lower interlayer dielectric layer 53, the preliminary semiconductor layer may fill the openings. The first semiconductor pattern 61*a* may include a first via part 61*av* and a first plate part 61*ap*, and the second semiconductor pattern 61*b* may include a second via part 61*bv* and a second plate part 61*bp*.

The first plate part 61*ap* and the second plate part 61*bp* may have their top surfaces located at a higher level than that of a top surface of the gate electrode 31.

A third lower interlayer dielectric layer 55 may be formed to cover a top surface of the second lower interlayer dielectric layer 53. The third lower interlayer dielectric layer 55 may cover the first plate part 61*ap* and the second plate part 61*bp*.

Referring to FIG. 16C, the third lower interlayer dielectric layer 55 may be patterned to form first openings OP1 that expose a portion of the first plate part 61*ap* and a portion of the second plate part 61*bp*.

The first plate part 61*ap* and the second plate part 61*bp* may be implanted with impurities having a first or second conductivity type to form a first contact region 62*a* and a second contact region 62*b*. The first contact region 62*a* may have an impurity concentration greater than that of the source region 11*a*, and the second contact region 62*b* may have an impurity concentration greater than that of the drain region 11*b*. Top surfaces of the first and second contact parts 62*a* and 62*b* are exposed via the first openings OP1.

Referring back to FIGS. 7, 8A, and 8B, first and second contact plugs CPa and CPb may be formed which are respectively coupled to the first and second semiconductor patterns 61*a* and 61*b*, and first and second peripheral conductive lines MLa and MLb may be formed which are respectively coupled to the first and second contact plugs CPa and CPb. In particular, the first and second contact plugs CPa and CPb may be respectively connected to the first and second contact parts 62*a* and 62*b*.

FIGS. 17 to 20 illustrate cross-sectional views showing a semiconductor device according to some embodiments of the present inventive concept.

Figure 17:
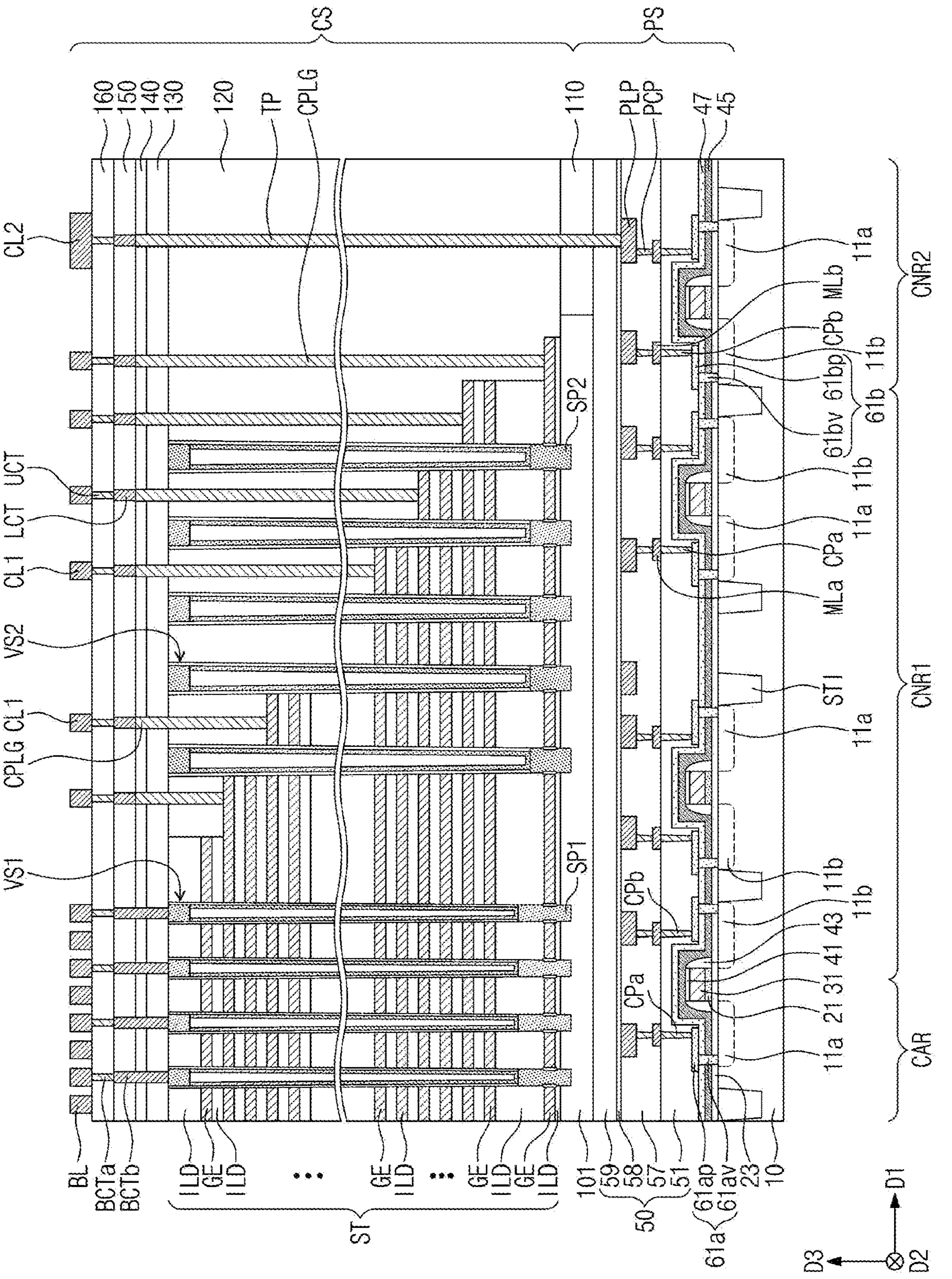
FIGS. 17, 18, 19 and 20 illustrate cross-sectional views showing a semiconductor device according to some embodiments of the present inventive concept.

Referring to FIG. 17, a semiconductor device may include a peripheral circuit structure PS on a semiconductor substrate 10 and a cell array structure CS on the peripheral circuit structure PS.

The peripheral circuit structure PS may include peripheral circuits integrated on an entire surface of the semiconductor substrate 10 and a lower dielectric layer 50 that covers the peripheral circuits.

The peripheral circuits may include row and column decoders, a page buffer, a voltage generator, and a control circuit that are integrated on the semiconductor substrate 10. For example, the peripheral circuits may include high-voltage transistors. The high-voltage transistors of the peripheral circuit structure PS may each include a source region 11*a* and a drain region 11*b* in the semiconductor substrate 10, a gate dielectric pattern 21 on the semiconductor substrate 10, a gate electrode 31 on the gate dielectric pattern 21, a gate capping pattern 41 on the gate electrode 31, gate spacers 43 on opposite lateral surfaces of the gate electrode 31, and first and second semiconductor patterns 61*a* and 61*b* on opposite sides of the gate electrode 31. The first semiconductor pattern 61*a* may include a first via part 61*ay* and a first plate part 61*ap*. The second semiconductor pattern 61*b* may include a second via part 61*bv* and a second plate part 61*bp*. The first and second semiconductor patterns 61*a* and 61*b*, the first and second via parts 61*av* and 61*bv*, and the first and second plate parts 61*ap* and 61*bp* may have substantially the same features as those of the first and second semiconductor patterns 61*a* and 61*b*, the first and second via parts 61*av* and 61*by*, and the first and second plate parts 61*ap* and 61*bp* that are discussed with reference to FIGS. 7 to 14B.

In an embodiment, the first and second semiconductor patterns 61*a* and 61*b* of the high-voltage transistor may be electrically connected to conductive patterns GE as the word lines (see WL of FIG. 1) of the cell array structure CS. In addition, the high-voltage transistors of the peripheral circuit structure PS may constitute a portion of the page buffer (see 1120 of FIG. 1) and may be electrically connected to bit lines BL.

The lower dielectric layer 50 may be provided on the entire surface of the semiconductor substrate 10. The lower dielectric layer 50 may include a plurality of stacked dielectric layers. For example, the lower dielectric layer 50 may include one or more of a silicon oxide layer, a silicon nitride layer, a silicon oxynitride layer, and a low-k dielectric layer. The lower dielectric layer 50 may include a first lower interlayer dielectric layer 51, a fourth lower interlayer dielectric layer 57, a fifth lower interlayer dielectric layer 59, and an etch stop layer 58 interposed between the fourth and fifth lower interlayer dielectric layers 57 and 59. The first lower interlayer dielectric layer 51, the fourth lower interlayer dielectric layer 57, the etch stop layer 58 and the fifth lower interlayer dielectric layer 59 are sequentially stacked. The etch stop layer 58 may include a dielectric material different from that of the fourth and fifth lower interlayer dielectric layers 57 and 59, and may cover top surfaces of uppermost peripheral circuit lines PLP.

The first lower interlayer dielectric layer 51 may cover the gate electrodes 31 on the semiconductor substrate 10, and the first and second plate parts 61*ap* and 61*bp* of the first and second semiconductor patterns 61*a* and 61*b* may be disposed in the first lower interlayer dielectric layer 51.

First and second contact plugs CPa and CPb may penetrate the first lower interlayer dielectric layer 51 to be respectively coupled to the first and second semiconductor patterns 61*a* and 61*b* of the high-voltage transistor. The fourth lower interlayer dielectric layer 57 may cover the first lower interlayer dielectric layer 51. In addition, on the first lower interlayer dielectric layer 51, first and second peripheral conductive lines MLa and MLb may be respectively coupled to the first and second contact plugs CPa and CPb.

The peripheral circuit lines PLP may be electrically connected through peripheral contact plugs PCP to the high-voltage transistors. The first and second peripheral conductive lines MLa and MLb, the peripheral circuit lines PLP, and the peripheral contact plugs PCP may be located in the fourth interlayer dielectric layer 57. The etch stop layer 58 and the fifth lower interlayer dielectric layer 59 may be sequentially stacked on the fourth lower interlayer dielectric layer 57.

The cell array structure CS may be disposed on the lower dielectric layer 50. The cell array structure CS may include a cell array region CAR and first and second connection regions CNR1 and CNR2, and the first connection region CNR1 may be positioned in a first direction D1 between the cell array region CAR and the second connection region CNR2.

The cell array structure CS may include a semiconductor layer 101, stack structures ST, first and second vertical structures VS1 and VS2, cell contact plugs CPLG, through plugs TP, bit lines BL, and first and second cell conductive lines CL1 and CL2.

According to some embodiments, the memory cell strings (see CSTR of FIG. 1) depicted in FIG. 1 may be integrated on the semiconductor layer 101. The stack structure ST and the first vertical structures VS1 may constitute the memory cell strings CSTR shown in FIG. 1.

The semiconductor layer 101 may be disposed on a top surface of the lower dielectric layer 50. The semiconductor layer 101 may be formed of a semiconductor material, a dielectric material, or a conductive material. The semiconductor layer 101 may include one or more of a semiconductor doped with impurities having a first conductivity type (e.g., n-type) and an intrinsic semiconductor doped with no impurities. The semiconductor layer 101 may have at least one selected from a monocrystalline structure, an amorphous structure, and a polycrystalline structure.

On the second connection region CNR2, a buried dielectric pattern 110 may be disposed to cover a sidewall of the semiconductor layer 101. The buried dielectric pattern 110 may be in contact with the lower dielectric layer 50. For example, the buried dielectric pattern 110 may contact the top surface of the fifth lower interlayer dielectric layer 59.

The stack structure ST may be disposed on the semiconductor layer 101. The stack structure ST may include conductive patterns GE and interlayer dielectric layers ILD that are alternately stacked along a direction perpendicular to a top surface of the semiconductor layer 101.

The stack structure ST may extend along the first direction D1 from the cell array region CAR toward the first connection region CNR1, and may have a stepwise structure on the first connection region CNR1. The conductive patterns GE may have their pad portions on the first connection region CNR1 that are in contact with the cell contact plugs CPLG. The stepwise structure of the stack structure ST may have a shape that is variously changed.

The conductive patterns GE may include, for example, at least one selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). The interlayer dielectric layers ILD may include one or more of a silicon oxide layer and a low-k dielectric layer. According to some embodiments, the semiconductor device may be a vertical NAND Flash memory device, and in this case, the conductive patterns GE of the stack structure ST may be used as the gate lower lines LL1 and LL2, the word lines WL, and the gate upper lines UL1 and UL2 that are discussed with reference to FIG. 1.

A planarized dielectric layer 120 may cover stepwise pad portions of the stack structure ST. The planarized dielectric layer 120 may have a substantially flat top surface. The planarized dielectric layer 120 may include one dielectric layer or a plurality of stacked dielectric layers. First, second, third, and fourth upper dielectric layers 130, 140, 150, and 160 may be sequentially stacked on the planarized dielectric layer 120.

The first vertical structures VS1 may penetrate the stack structure ST on the cell array region CAR. When viewed in a plan, the first vertical structures VS1 may be arranged in one direction or a zigzag fashion.

On the first connection region CNR1, the second vertical structures VS2 may penetrate the planarized dielectric layer 120 and the stack structure ST. The second vertical structures VS2 may penetrate the pad portions of the conductive patterns GE.

Each of the first and second vertical structures VS1 and VS2 may include a vertical semiconductor pattern and a data storage pattern that surrounds a sidewall of the vertical semiconductor pattern. The data storage pattern may be a data storage element of a NAND Flash memory device, and the data storage element may include a tunnel dielectric layer, a charge storage layer, and a blocking dielectric layer.

A first semiconductor pillar SP1 may be provided between the first vertical structure VS1 and the semiconductor layer 101, and a second semiconductor pillar SP2 may be provided between the second vertical structure VS2 and the semiconductor layer 101.

The first and second semiconductor pillars SP1 and SP2 may penetrate the conductive pattern GE provided at bottom of the stack structure ST. The first and second semiconductor pillars SP1 and SP2 may be in direct contact with the semiconductor layer 101, and may include an epitaxial layer grown from the semiconductor layer 101. The first and second semiconductor pillars SP1 and SP2 may electrically connect the semiconductor layer 101 to the vertical semiconductor patterns of the first and second vertical structures VS1 and VS2. The first and second semiconductor pillars SP1 and SP2 may include silicon (Si), germanium (Ge), silicon-germanium (Ge), a III-V group semiconductor compound, or a II-VI group semiconductor compound.

The cell contact plugs CPLG may penetrate the first and second upper dielectric layers 130 and 140 and the planarized dielectric layer 120 to be correspondingly coupled to the pad portions of the conductive patterns GE. The cell contact plugs CPLG may have vertical lengths decrease as they get closer to the cell array region CAR. The cell contact plugs CPLG may have their top surfaces substantially coplanar with each other. The first cell conductive lines CL1 may be disposed on the fourth upper dielectric layer 160 on the first connection region CNR1, and may be coupled to the cell contact plugs CPLG through lower and upper contact plugs LCT and UCT.

The bit lines BL may be disposed on the fourth upper dielectric layer 160 on the cell array region CAR, and may run across the stack structure ST. The bit lines BL may be electrically connected to the first vertical structures VS1 through lower and upper bit-line contact plugs BCTa and BCTb.

On the second connection region CNR2, the though plugs TP may penetrate the first and second upper dielectric layers 130 and 140, the planarized dielectric layer 120, and the buried dielectric pattern 110, thereby being coupled to the peripheral circuit line PLP. The through plugs TP may be horizontally spaced apart from the stack structure ST. The through plugs TP may be connected through the second cell conductive lines CL2 to the cell contact plugs CPLG. For example, the high-voltage transistor of the peripheral circuit structure PS may be electrically connected to the conductive patterns GE of the cell array structure CS through the cell contact plugs CPLG, the second cell conductive lines CL2, and the through plugs TP.

Figure 18:
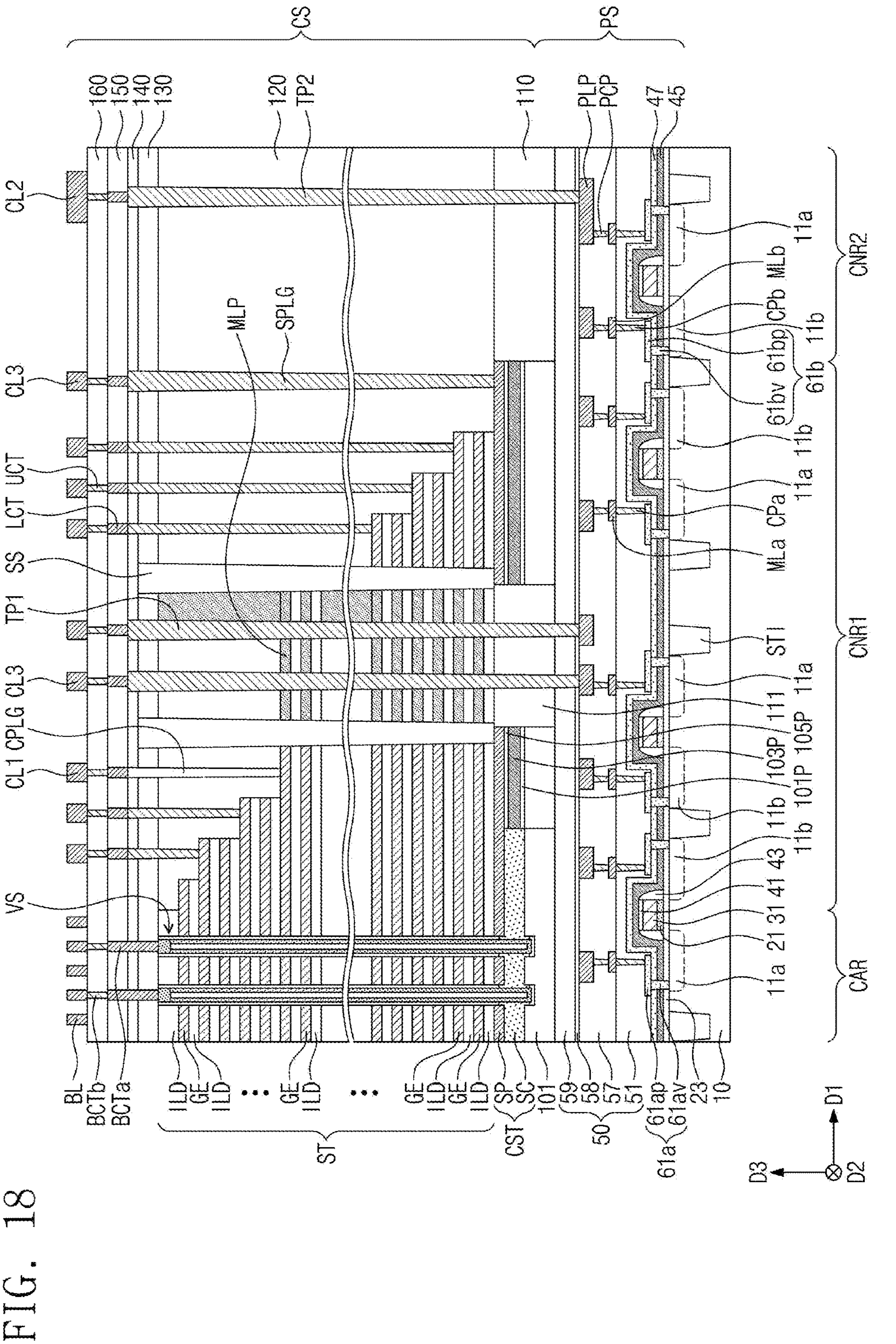
Figure 19:
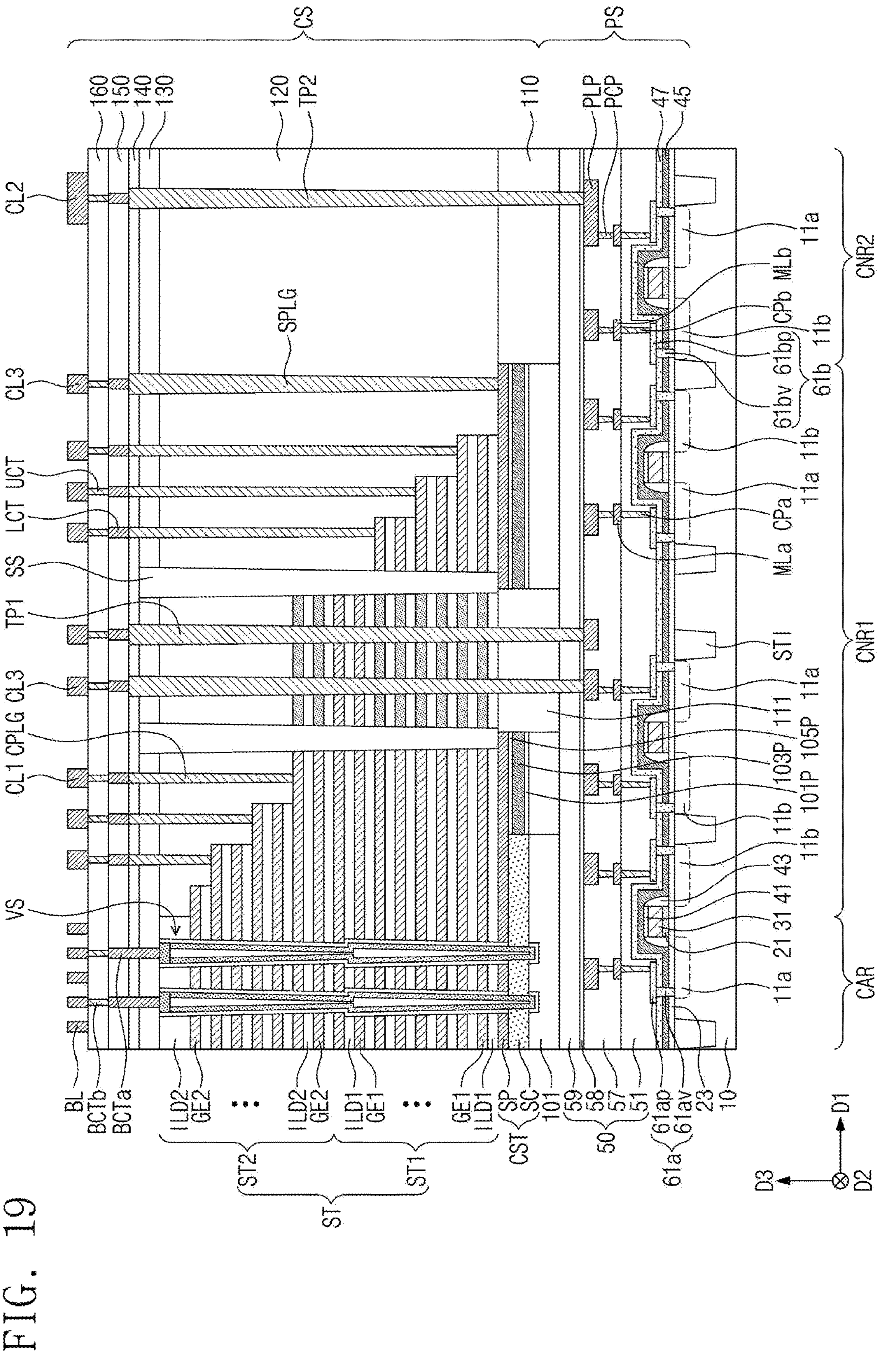
Figure 20:
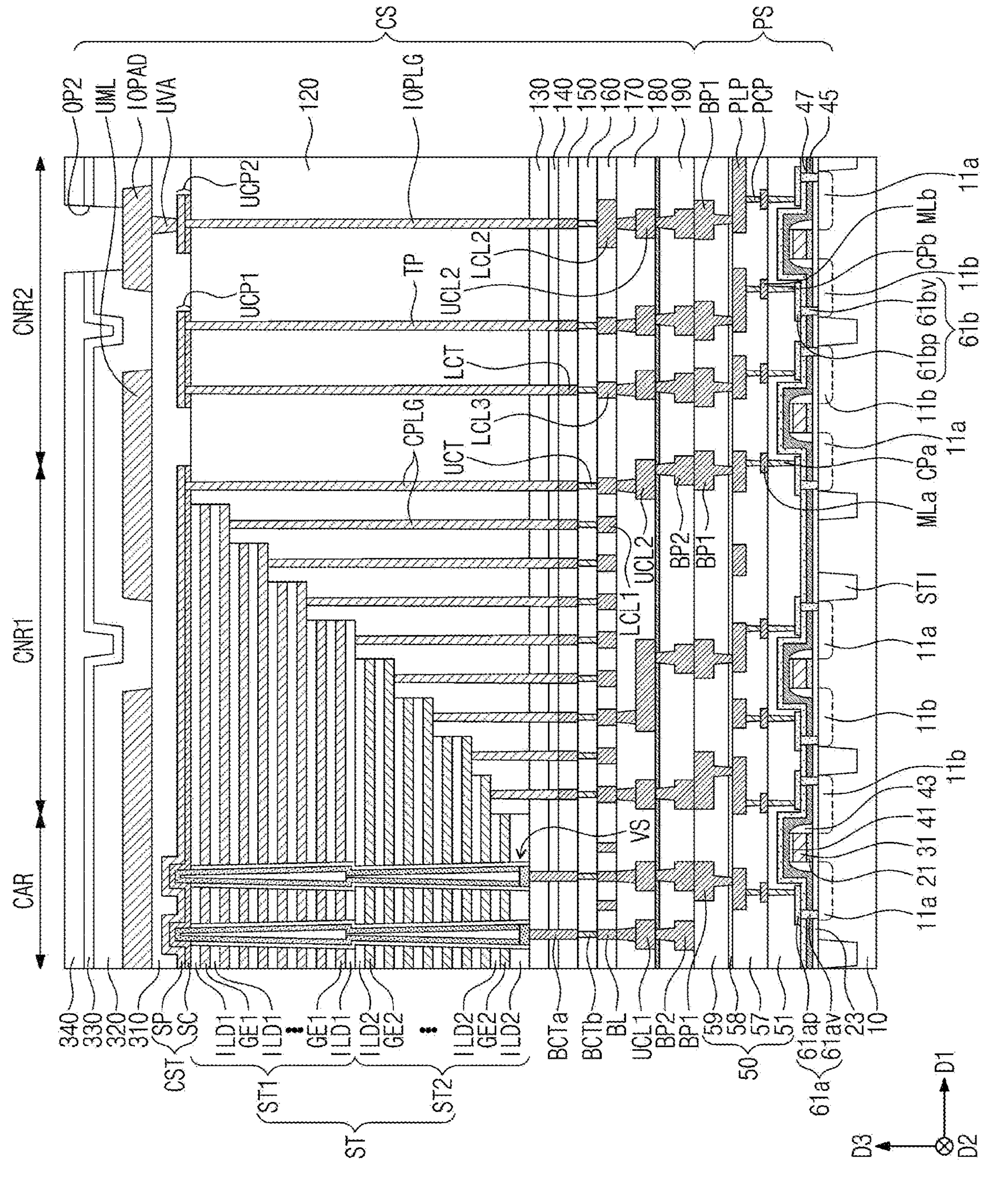

Like the semiconductor device discussed above with reference to FIG. 17, a semiconductor device according to some embodiments depicted in FIGS. 18 to 20 may include the peripheral circuit structure PS and the cell array structure CS. For brevity of description, a detailed description of technical features the same as those of the semiconductor device discussed above with reference to FIG. 17 will be omitted, and a difference thereof will explained.

Referring to FIG. 18, as discussed above, the peripheral circuit structure PS nay include high-voltage transistors.

According to the present embodiment, the cell array structure CS may further include a source structure CST between the semiconductor layer 101 and the stack structure ST.

The source structure CST may include a source conductive pattern SC and a support conductive pattern SP on the source conductive pattern SC. The source structure CST may be parallel to the top surface of the semiconductor layer 101, and on the cell array region CAR, the source structure CST may extend parallel to the stack structure ST.

On the cell array region CAR, the source conductive pattern SC may be disposed between the semiconductor layer 101 and the stack structure ST. The source conductive pattern SC may be formed of a semiconductor material doped with impurities (e.g., phosphorus (P) or arsenic (As)) having a first conductivity type. For example, the source conductive pattern SC may be formed of a polysilicon layer doped with n-type impurities.

The support conductive pattern SP may cover a top surface of the source semiconductor pattern SC on the cell array region CAR, and may also cover top surfaces of first, second, and third dummy dielectric patterns 101*p*, 103*p*, and 105*p* on the first connection region CNR1. The support conductive pattern SP may include one or more of a semiconductor doped with impurities having a first conductivity type (e.g., n-type) and an intrinsic semiconductor doped with no impurities. On the cell array region CAR, portions of the support conductive pattern SP may penetrate the source conductive pattern SC to come into contact with the semiconductor layer 101.

According to some embodiments, on the first connection region CNR1, a lower through dielectric pattern 111 may be provided to penetrate the source structure CST and the semiconductor layer 101. The lower through dielectric pattern 111 may be in contact with the lower dielectric layer 50.

On the first connection region CNR1, the first, second, and third dummy dielectric patterns 101*p*, 103*p*, and 105*p* may be disposed which are sequentially stacked between the semiconductor layer 101 and the stack structure ST. The second dummy dielectric pattern 103*p* may include a dielectric material different from those of the first and third dummy dielectric patterns 101*p* and 105*p*. The second dummy dielectric pattern 103*p* may be thicker than the first and third dummy dielectric patterns 101*p* and 105*p*. The first, second, and third dummy dielectric patterns 101*p*, 103*p*, and 105*p* may include at least one selected from a silicon oxide layer, a silicon nitride layer, a silicon oxynitride layer, a silicon carbide layer, and a silicon-germanium layer.

On the second connection region CNR2, a buried dielectric pattern 110 may be disposed to cover the sidewall of the semiconductor layer 101 and a sidewall of the source structure CST. The buried dielectric pattern 110 may be in contact with the lower dielectric layer 50, and may have a top surface substantially the same as that of the source structure CST.

According to some embodiments, the stack structure ST may include mold patterns MLP that are located at the same levels as those of the conductive patterns GE on the first connection region CNR1 and are correspondingly disposed between the interlayer dielectric layers ILD. The mold patterns MLP may be spaced apart from corresponding conductive patterns GE along the first direction D1. The mold patterns MLP may include a dielectric material different from that of the interlayer dielectric layers ILD. The mold patterns MLP may include, for example, at least one selected from silicon nitride, silicon oxynitride, and silicon-germanium. The mold patterns MLP may be closer to the cell array region CAR than the pad portions of the conductive patterns GE. In addition, when viewed in a plan, the mold patterns MLP may overlap the lower through dielectric pattern 111.

On the cell array region CAR, a plurality of first vertical structures VS1 may penetrate the stack structure ST and the source structure CST. The first vertical structures VS1 may each include a vertical semiconductor pattern a portion of which is in contact with the source conductive pattern SC.

A through dielectric pattern SS may penetrate a portion of the stack structure ST on the first connection region CNR1. The through dielectric pattern SS may be provided between the conductive patterns GE and the mold patterns MLP. When viewed in a plan, the through dielectric pattern SS may surround the mold patterns MLP. The through dielectric pattern SS may include a dielectric layer that covers a sidewall of the stack structure ST and sidewalls of the mold patterns MLP. The through dielectric pattern SS may be in contact with one or more of a top surface of the support conductive pattern SP and a top surface of the lower through dielectric pattern 111.

On the first connection region CNR1, first through plugs TP1 may vertically penetrate the through dielectric pattern 111 and the mold patterns MLP of the stack structure ST, thereby being connected to the peripheral circuit lines PLP. The first through plugs TP1 may be electrically connected the cell contact plugs CPLG through third cell conductive lines CL3.

On the second connection region CNR2, second though plugs TP2 may penetrate the first and second upper dielectric layers 130 and 140, the planarized dielectric layer 120, and the buried dielectric pattern 110, thereby being coupled to the peripheral circuit lines PLP. The second through plugs TP2 may be electrically connected to the cell contact plugs CPLG through second cell conductive lines CL2.

Referring to FIG. 19, the stack structure ST on the semiconductor layer 101 may include a first stack structure ST1 and a second stack structure ST2 on the first stack structure ST1. The first stack structure ST1 may include first conductive patterns GE1 that are stacked in a vertical direction on the semiconductor layer 101. The first stack structure ST1 may further include first interlayer dielectric layers ILD1 that separate the stacked first conductive patterns GE1 from each other. The first interlayer dielectric layers ILD1 and the first conductive patterns GE1 of the first stack structure ST1 may be alternately stacked in a third direction D3. A second interlayer dielectric layer ILD2 may be provided at top of the first stack structure ST1.

On the first stack structure ST1, the second stack structure ST2 may include second conductive patterns GE2 that are stacked in a direction perpendicular to the top surface of the semiconductor layer 101. The second stack structure ST2 may further include second interlayer dielectric layers ILD2 that separate the stacked second conductive patterns GE2 from each other. The second interlayer dielectric layers ILD2 and the second conductive patterns GE2 of the second stack structure ST2 may be alternately stacked in a direction perpendicular to the top surface of the semiconductor layer 101.

Each of the vertical structures VS may include a first vertical extension part that penetrates the first stack structure ST1, a second vertical extension part that penetrates the second stack structure ST2, and an expansion part between the first and second vertical extension parts. The expansion part may be provided in an uppermost first interlayer dielectric layer ILD1. The vertical channel structure VS may have a diameter that abruptly increases at the expansion part thereof. In other words, the diameter of the vertical channel structure VS near the top of the second stack structure ST2 may be greater than its diameter near a lower portion of the second stack structure ST2.

Referring to FIG. 20, the cell array structure CS may be bonded onto the peripheral circuit structure PS, and thus a semiconductor device according to the present inventive concept may have an increased cell volume per unit area. In addition, the peripheral circuit structure PS and the cell array structure CS may be fabricated independently of each other and bonded to each other, and thus the peripheral circuits may be prevented from damage caused by various heat treatments, which may result in an improvement in reliability and electrical properties of the semiconductor device according to the present inventive concept.

The peripheral circuit structure PS may further include first bonding pads BP1 disposed in the fifth lower interlayer dielectric layer 59. The fifth lower interlayer dielectric layer 59 may not cover top surfaces of the first bonding pads BP1. A top surface of the fifth lower interlayer dielectric layer 59 may be substantially coplanar with the top surfaces of the first bonding pads BP1. The first bonding pads BP1 may be electrically connected through the peripheral circuit lines PLP and the peripheral contact plugs PCP to the peripheral circuits.

The cell array structure CS may be provided on the peripheral circuit structure PS. The cell array structure CS of the semiconductor device may include a cell array region CAR and first and second connection regions CNR1 and CNR2, and the first connection region CNR1 may be positioned in the first direction D1 between the cell array region CAR and the second connection region CNR2.

The cell array structure CS may include a memory cell array including three-dimensionally arranged memory cells. The cell array structure CS may include a stack structure ST, a source structure CST, vertical structures VS, bit lines BL, cell contact plugs CPLG, through plugs TP, and input/output contact plugs IOPLG.

The stack structure ST may include first and second conductive patterns GE1 and GE2 that are stacked to have an inverse stepwise structure on the first connection region CNR1. For example, the first and second conductive patterns GE1 and GE2 may have their lengths in the first direction D1 that increase with increasing distance from the peripheral circuit structure PS.

Each of the first and second conductive patterns GE1 and GE2 may include a pad portion on the first connection region CNR1. The pad portions of the first and second conductive patterns GE1 and GE2 may be located at positions that are horizontally and vertically different from each other. The cell contact plugs CPLG may be correspondingly coupled to the pad portions of the first and second conductive patterns GE1 and GE2.

In some embodiments, the stack structure ST may include a first stack structure ST1 and a second stack structure ST2 on the first stack structure ST1. The first stack structure ST1 may include first interlayer dielectric layers ILD1 and first conductive patterns GE1 that are alternately stacked, and the second stack structure ST2 may include second interlayer dielectric layers ILD2 and second conductive patterns GE2 that are alternately stacked.

The second stack structure ST2 may be disposed between the first stack structure ST1 and the peripheral circuit structure PS. For example, the second stack structure ST2 may be provided on a bottom surface of a lowermost one of the first interlayer dielectric layers ILD1 included in the first stack structure ST1. Although an uppermost one of the second interlayer dielectric layers ILD2 of the second stack structure ST2 is in contact with the lowermost one of the first interlayer dielectric layers ILD1 of the first stack structure ST1, the present inventive concept is not limited thereto, and a single-layered dielectric layer may be provided between an uppermost one of the second conductive patterns GE2 of the second stack structure ST2 and a lowermost one of the first conductive patterns GE1 of the first stack structure ST1.

A lowermost one of the second conductive patterns GE2 of the second stack structure ST2 may have a minimum length in the first direction D1, and an uppermost one of the first conductive patterns GE1 of the first stack structure ST1 may have a maximum length in the first direction D1.

A planarized dielectric layer 120 may cover stepwise ends (or pad portions) of the stack structures ST. The planarized dielectric layer 120 may have substantially flat top and bottom surfaces. The planarized dielectric layer 120 may include one dielectric layer or a plurality of stacked dielectric layers. The top surface of the planarized dielectric layer 120 may be substantially coplanar with that of an uppermost interlayer dielectric layer ILD1 of the stack structure ST, and the bottom surface of the planarized dielectric layer 120 may be substantially coplanar with that of a lowermost interlayer dielectric layer ILD2 of the stack structure ST.

The source structure CST may be disposed on an uppermost first interlayer dielectric layer ILD1 of the first stack structure ST1. The source structure CST may have a uniform thickness. The source structure CST may extend in the first direction D1 and the second direction D2 on the cell array region CAR and the first connection region CNR1. A length in the first direction D1 of the source structure CST may be greater than a length in the first direction D1 of the uppermost first conductive pattern GE1 of the first stack structure ST1.

The source structure CST may include a source conductive pattern SC and a support conductive pattern SP on the source conductive pattern SC. The source conductive pattern SC may be connected to a vertical semiconductor pattern of each of the vertical structures VS.

On the second connection region CNR2, a first upper conductive pattern UCP1 and a second upper conductive pattern UCP2 may be disposed on the top surface of the planarized dielectric layer 120, and may be located at substantially the same level as that of the source structure CST. The first upper conductive pattern UCP1 and the second upper conductive pattern UCP2 may include the same conductive material as that of the source structure CST.

On the cell array region CAR, a plurality of vertical structures VS may penetrate the stack structure ST to come into connection with the source structure CST. When viewed in a plan, the vertical structures VS may be arranged in one direction or a zigzag fashion.

Each of the vertical structures VS may include a first vertical extension part and a second vertical extension part. The first vertical extension part and the second vertical extension part may constitute a single unitary body that continuously extends with no interface therebetween. The first vertical extension part may have a sidewall having a uniform slope between lower and upper portions thereof. Likewise, the second vertical extension part may have a sidewall having a uniform slope between lower and upper portions thereof. For example, each of the first and second vertical extension pars may have a width in the first direction D1 or the second direction D2, and the width may decrease with increasing distance from the semiconductor substrate 10. Each of the vertical structures VS may have different diameters at a portion where the first and second vertical extension parts are connected to each other. A step difference may be formed at the portion where the first and second vertical extension parts are connected to each other.

The present inventive concept, however, is not limited thereto, and different from that shown, each of the vertical structures VS may have three or more vertical extension parts and, a step difference may be present at each of two or more boundaries between three or more vertical extension parts that constitute the vertical structure VS. Alternatively, each of the vertical structures VS may have a flat sidewall with no step difference.

A first dielectric layer 310 may be disposed on the planarized dielectric layer 120 and the stack structure ST. The first dielectric layer 310 may cover the source structure CST and the planarized dielectric layer 120. An upper via UVA may be disposed in the first dielectric layer 310. The upper via UVA may contact the second upper conductive pattern UCP2.

Upper metal lines UML and an input/output pad IOPAD may be provided on the first dielectric layer 310. A second dielectric layer 320 may cover a portion of the input/output pad IOPAD and the upper metal lines UML. A capping dielectric layer 330 and a passivation layer 340 may be sequentially disposed on the second dielectric layer 320. The second dielectric layer 320, the capping dielectric layer 330, and the passivation layer 340 may have a second opening OP2 that expose a portion of the input/output pad IOPAD.

The capping dielectric layer 330 may include, for example, a silicon nitride layer or a silicon oxynitride layer. The passivation layer 340 may include a polyimide-based material, such as photosensitive polyimide (PSPI).

A bit-line conductive pad may be formed on a bottom end of the vertical structure VS, and a lower bit-line contact plug BCTa may penetrate the first, second, and third upper dielectric layers 130, 140, and 150 to come into contact with the bit-line conductive pad. The bit-line conductive pad may include an impurity-undoped semiconductor material, an impurity-doped semiconductor material, or a conductive material. An upper bit-line contact plug BCTb may penetrate the fourth upper dielectric layer 160 to be coupled to the low bit-line contact plug BCTa.

On the first connection region CNR1, the cell contact plugs CPLG may penetrate the first and second upper dielectric layers 130 and 140 and the planarized dielectric layer 120 to be correspondingly coupled to pad portions of the first and second conductive patterns GE1 and GE2. The cell contact plugs CPLG may have their vertical lengths that decrease with decreasing distance from the cell array region CAR. The cell contact plugs CPLG may have their top surfaces substantially coplanar with each other.

On the second connection region CNR2, the through plugs TP may penetrate the first and second upper dielectric layers 130 and 140 and the planarized dielectric layer 120, thereby being coupled to the first upper conductive pattern UCP1. On the second connection region CNR2, the input/output contact plug IOPLG may penetrate the first and second upper dielectric layers 130 and 140 and the planarized dielectric layer 120, thereby being coupled to the second upper conductive pattern UCP2. The input/output contact plug IOPLG may be electrically connected to the input/output pad IOPAD through the second upper conductive pattern UCP2 and the upper via UVA.

On the cell array region CAR, the bit lines BL may be disposed on the fourth upper dielectric layer 160. The bit lines BL may extend in the second direction D2, while ruining across the stack structure ST. The bit lines BL may be electrically connected to the vertical structures VS through the lower and tipper bit-line contact plugs BCTa and BCTb.

First lower conductive lines LCL1 may be disposed on the fourth tipper dielectric layer 160 on the first connection region CNR1, and may be coupled to the cell contact plugs CPLG. Second lower conductive lines LCL2 and third lower conductive lines LCL3 may be disposed on the fourth upper dielectric layer 160 on the second connection region CNR2, and may be coupled to the through plugs TP and the input/output contact plugs IOPLG.

A fifth upper dielectric layer 170 may be disposed on the fourth upper dielectric layer 160, and the bit lines BL and the first, second, and third lower conductive lines LCL1, LCL2, and LCL3. In particular, the first, second, and third lower conductive lines LCL1, LCL2, and LCL3 may be provided in the fifth upper dielectric layer 170.

A sixth upper dielectric layer 180 may be disposed on the fifth upper dielectric layer 170, and first and second tipper conductive lines UCL1 and UCL2 may be disposed in the sixth upper dielectric layer 180. On the cell array region CAR, the first upper conductive lines UCL1 may be electrically connected to the bit lines BL. On the first and second connection regions CNR1 and CNR2, the second upper conductive lines UCL2 may be electrically connected to the first and second lower conductive lines LCL1 and LCL2.

The first, second, and third lower conductive lines LCL1, LCL2, and LCL3 and the first and second upper conductive lines UCL1 and UCL2 may include at least one selected from metal (e.g., tungsten, copper, or aluminum), conductive metal nitride (e.g., titanium nitride or tantalum nitride), and a transition metal (e.g., titanium or tantalum). For example, the first, second, and third lower conductive lines LCL1, LCL2, and LCL3 may be formed of tungsten whose electrical resistivity is relatively high, and the first and second upper conductive lines UCL1 and UCL2 may be formed of copper whose electrical resistivity is relatively low.

A seventh upper dielectric layer 190 may be disposed on the sixth upper dielectric layer 180, and second bonding pads BP2 may be disposed in the seventh upper dielectric layer 190. The second bonding pads BP2 may be electrically connected to the first and second upper conductive lines UCL1 and UCL2. The second bonding pads BP2 may be formed of aluminum, copper, or tungsten.

A bonding method may be employed to electrically and physically connect the second bonding pads BP2 to the first bonding pads BP1. For example, the second bonding pads BP2 may be in direct contact with the first bonding pads BP1.

The second bonding pads BP2 may include the same metallic material as that of the first bonding pads BP1. The second bonding pads BP2 may have substantially the same shape, width, and area as those of the first bonding pads BP1.

According to some embodiments illustrated in FIGS. 17 to 20, a semiconductor device may include first and second semiconductor patterns 61*a* and 61*b* on opposite sides of the gate electrode 31. One of the first and second semiconductor patterns 61*a* and 61*b* may include a corresponding one of via parts 61*av* and 61*bv* and a corresponding one of plate parts 61*ap* and 61*bp* on the via parts 61*av* and 61*bv*. The first and second plate parts 61*ap* and 61*bp* may each have a major axis and a minor axis, and when viewed in a plan, the first and second contact plugs CPa and CPb coupled to the first and second semiconductor patterns 61*a* and 61*b* may be laterally spaced apart from the first and second via parts 61*av* and 61*bv*. Therefore, when high-voltage transistors operate, an increased current path may be provided between sources and drains, and as a result, junction breakdown voltages may increase. Accordingly, a semiconductor device may have improved reliability and increased integration.

According to some embodiments of the present inventive concept, even when transistors of a peripheral circuit structure have reduced areas due to an increase in integration of a semiconductor device, it may be possible to secure breakdown voltages of high-voltage transistors.

Although the present inventive concept has been described in connection with some embodiments thereof, it will be understood by those skilled in the art that various changes and modifications may be made thereto without departing from the scope and spirit of the present inventive concept as set forth in the following claims.

What is claimed is:

1. A semiconductor device, comprising:

a gate electrode on a semiconductor substrate;

a gate dielectric pattern between the gate electrode and the semiconductor substrate;

a first semiconductor pattern on the semiconductor substrate adjacent to a first side of the gate electrode, wherein the first semiconductor pattern includes a first via part in contact with the semiconductor substrate, and a first plate part on the first via part;

a second semiconductor pattern on the semiconductor substrate adjacent to a second side of the gate electrode, wherein the second semiconductor pattern includes a second via part in contact with the semiconductor substrate, and a second plate part on the second via part;
a first contact plug connected to the first plate part; and
a second contact plug connected to the second plate part,
wherein each of the first and second plate parts extends lengthwise in a direction parallel to a top surface of the semiconductor substrate,
wherein the first plate part includes a first contact region that overlaps the first contact plug,
wherein the second plate part includes a second contact region that overlaps the second contact plug,
wherein the first contact region has an impurity concentration greater than an impurity concentration of the first via part, and
wherein the second contact region has an impurity concentration greater than an impurity concentration of the second via part.

2. The semiconductor device of claim 1, further comprising:
a source region in the semiconductor substrate, the source region overlapping the first via part; and
a drain region in the semiconductor substrate, the drain region overlapping the second via part,
wherein the impurity concentration of the first contact region is greater than an impurity concentration of the source region, and
wherein the impurity of the second contact region is greater than an impurity concentration of the drain region.

3. The semiconductor device of claim 1, wherein the first via part is closer to the gate electrode than the second via part.

4. The semiconductor device of claim 1, further comprising a lower interlayer dielectric layer on the semiconductor substrate, the lower interlayer dielectric layer covering the gate electrode and the first and second plate parts,
wherein the first and second contact plugs penetrate the lower interlayer dielectric layer.

5. The semiconductor device of claim 1, wherein top surfaces of the first and second semiconductor patterns are at a vertical level lower than a vertical level of a top surface of the gate electrode.

6. The semiconductor device of claim 1, wherein top surfaces of the first and second semiconductor patterns are at a vertical level higher than a vertical level of a top surface of the gate electrode.

7. The semiconductor device of claim 1, wherein the first and second semiconductor patterns are symmetrical to each other about the gate electrode.

8. The semiconductor device of claim 1, wherein the first and second semiconductor patterns are asymmetrical to each other about the gate electrode.

9. The semiconductor device of claim 8, wherein
the gate electrode extends in a first direction parallel to the top surface of the substrate,
the first plate part extends lengthwise in the first direction, and
the second plate part extends lengthwise in a second direction that intersects the first direction.

10. A semiconductor device, comprising:
a device isolation layer that defines an active region on a semiconductor substrate;
a gate electrode disposed on the active region;
a gate dielectric pattern between the gate electrode and the semiconductor substrate;
a semiconductor pattern on a first side of the gate electrode, wherein the semiconductor pattern includes a via part in contact with the semiconductor substrate and a plate part on the via part; and
a contact plug in contact with a portion of the plate part and non-overlapping vertically with the via part.

11. The semiconductor device of claim 10, wherein the contact plug is closer to the gate electrode than the via part.

12. The semiconductor device of claim 10, wherein the via part is closer to the gate electrode than the contact plug.

13. The semiconductor device of claim 10, further comprising a dielectric pattern that covers the gate electrode,
wherein the dielectric pattern extends along the first side of the gate electrode and onto a top surface of the semiconductor substrate, and
wherein the via part penetrates the dielectric pattern.

14. The semiconductor device of claim 13, wherein the plate part is on the dielectric pattern.

15. The semiconductor device of claim 13, further comprising:
a first lower interlayer dielectric layer that covers a portion of the dielectric pattern; and
a second lower interlayer dielectric layer on the first lower interlayer dielectric layer,
wherein the via part further penetrates the first lower interlayer dielectric layer,
wherein the plate part is on the first lower interlayer dielectric layer, and
wherein a top surface of the first lower interlayer dielectric layer is at a vertical level higher than a vertical level of a top surface of the gate electrode.

16. A semiconductor device, comprising:
a peripheral circuit structure that includes peripheral circuits integrated on a semiconductor substrate; and
a cell array structure on the peripheral circuit structure and including memory cells that are three-dimensionally arranged on a semiconductor layer,
wherein the peripheral circuit structure includes:
a gate electrode on the semiconductor substrate;
a gate dielectric pattern between the gate electrode and the semiconductor substrate;
a source region and a drain region in the semiconductor substrate, and adjacent to a corresponding one of opposite sides of the gate electrode, respectively;
a plurality of semiconductor patterns correspondingly coupled to the source region and the drain region, each of the semiconductor patterns including a via part that penetrates a dielectric layer on the semiconductor substrate and a plate part connected to the via part on the dielectric layer; and
a plurality of contact plugs correspondingly coupled to the plurality of semiconductor patterns, each of the contact plugs being in contact with a portion of the plate part,
wherein the plate part extends lengthwise in a direction parallel to a top surface of the semiconductor substrate, and
wherein top surfaces of the semiconductor patterns are at a vertical level lower than a vertical level of a top surface of the gate electrode and higher than a vertical level of a top surface of the semiconductor substrate.

17. The semiconductor device of claim 16, wherein, when viewed in a plan, the contact plugs are correspondingly spaced apart from the via parts.

18. The semiconductor device of claim 16, wherein the cell array structure includes:

a stack structure that includes conductive patterns and interlayer dielectric layers that are vertically and alternately stacked;

a plurality of vertical structures that penetrate the stack structure; and a plurality of hit lines that run across the stack structure and are connected to the vertical structures, wherein lengths in a first direction of the conductive patterns decrease as the conductive patterns increase in distance from a top surface of the semiconductor substrate.

* * * * *